US008970316B2

(12) United States Patent
Ishii

(10) Patent No.: US 8,970,316 B2
(45) Date of Patent: *Mar. 3, 2015

(54) RESONATING ELEMENT, RESONATOR, ELECTRONIC DEVICE, ELECTRONIC APPARATUS, AND MOBILE OBJECT

(75) Inventor: Osamu Ishii, Tatsuno (JP)

(73) Assignee: Seiko Epson Corporation (JP)

( * ) Notice: Subject to any disclaimer, the term of this patent is extended or adjusted under 35 U.S.C. 154(b) by 35 days.

This patent is subject to a terminal disclaimer.

(21) Appl. No.: 13/587,186

(22) Filed: Aug. 16, 2012

(65) Prior Publication Data

US 2013/0043959 A1    Feb. 21, 2013

(30) Foreign Application Priority Data

Aug. 19, 2011 (JP) .................. 2011-179405
Jun. 27, 2012 (JP) .................. 2012-143908

(51) Int. Cl.
| H03B 5/32 | (2006.01) |
|---|---|
| H01L 41/04 | (2006.01) |
| H03H 9/10 | (2006.01) |
| H03H 9/19 | (2006.01) |
| H03H 9/05 | (2006.01) |
| H03H 9/13 | (2006.01) |

(52) U.S. Cl.
CPC .............. *H03H 9/0552* (2013.01); *H03H 9/19* (2013.01); *H03H 9/0542* (2013.01); *H03H 9/1021* (2013.01); *H03H 9/131* (2013.01)
USPC ........... 331/158; 310/344; 310/348; 310/368

(58) Field of Classification Search
USPC ................. 310/315, 344, 346, 348, 368, 370; 331/154, 156, 158
See application file for complete search history.

(56) References Cited

U.S. PATENT DOCUMENTS

| 3,694,677 | A | 9/1972 | Guttwein et al. |
|---|---|---|---|
| 4,454,444 | A | 6/1984 | Fujiwara et al. |
| 5,185,550 | A | 2/1993 | Morita et al. |
| 5,235,240 | A | 8/1993 | Morita et al. |
| 5,307,034 | A | 4/1994 | Morita et al. |
| 5,436,523 | A * | 7/1995 | Staudte .................. 310/348 |
| 6,750,593 | B2 | 6/2004 | Iwata |
| 6,987,347 | B2 | 1/2006 | Yoshio et al. |
| 7,098,574 | B2 | 8/2006 | Iwata |
| 7,235,913 | B2 | 6/2007 | Iwata |
| 7,298,069 | B2 * | 11/2007 | Yagishita ............... 310/367 |
| 7,436,106 | B2 * | 10/2008 | Maruyama ............. 310/348 |
| 8,026,652 | B2 | 9/2011 | Yasuike |

(Continued)

FOREIGN PATENT DOCUMENTS

| JP | 59-040715 | 3/1984 |
|---|---|---|
| JP | 61-187116 | 11/1986 |

(Continued)

*Primary Examiner* — Levi Gannon
(74) *Attorney, Agent, or Firm* — Harness, Dickey & Pierce, P.L.C.

(57) ABSTRACT

A piezoelectric resonating element includes a piezoelectric substrate that includes a rectangular vibrating section and a thick section integrally formed with the vibrating section, excitation electrodes, and lead electrodes. The thick section includes a first thick section and a second thick section of which one end is formed continuous to the first thick section. The first thick section includes a first inclined section of which the thickness changes and a first thick section main body of a quadrangle column shape, and at least one slit is provided in the first thick section.

20 Claims, 24 Drawing Sheets

(56) References Cited

U.S. PATENT DOCUMENTS

| | | | |
|---|---|---|---|
| 8,234,774 B2* | 8/2012 | Hagelin et al. | 29/594 |
| 2004/0036380 A1 | 2/2004 | Oda et al. | |
| 2008/0048527 A1* | 2/2008 | Yoshio et al. | 310/348 |
| 2011/0241790 A1* | 10/2011 | Amano | 331/156 |
| 2012/0306321 A1* | 12/2012 | Ishii | 310/348 |
| 2013/0043960 A1* | 2/2013 | Ishii et al. | 331/158 |

FOREIGN PATENT DOCUMENTS

| | | |
|---|---|---|
| JP | 02-079508 | 3/1990 |
| JP | 03-235409 | 10/1991 |
| JP | 08-084044 | 3/1996 |
| JP | 09-246903 | 9/1997 |
| JP | 09-326667 | 12/1997 |
| JP | 2000-278080 A | 10/2000 |
| JP | 2001-016069 | 1/2001 |
| JP | 2001-144578 | 5/2001 |
| JP | 2001-251160 | 9/2001 |
| JP | 2002-033640 | 1/2002 |
| JP | 2002-198772 | 7/2002 |
| JP | 2002-246869 | 8/2002 |
| JP | 2003-087087 | 3/2003 |
| JP | 2003-110388 | 4/2003 |
| JP | 2003-264446 | 9/2003 |
| JP | 2004-088138 | 3/2004 |
| JP | 2004-165743 | 6/2004 |
| JP | 2004-165798 | 6/2004 |
| JP | 2004-260695 | 9/2004 |
| JP | 2005-020141 | 1/2005 |
| JP | 2005-033293 A | 2/2005 |
| JP | 2005-303825 | 10/2005 |
| JP | 2005-354588 | 12/2005 |
| JP | 2006-203700 | 8/2006 |
| JP | 2007-158486 | 6/2007 |
| JP | 2007-214941 | 8/2007 |
| JP | 2007-318350 | 12/2007 |
| JP | 2009-135856 | 6/2009 |
| JP | 2009-158999 | 7/2009 |
| JP | 2009-159000 | 7/2009 |
| JP | 2009-164824 | 7/2009 |
| JP | 2009-188483 | 8/2009 |
| JP | 2009-246583 | 10/2009 |
| JP | 2010-011222 | 1/2010 |
| JP | 2010-074840 | 4/2010 |
| JP | 2010-268498 | 11/2010 |
| JP | 2011-045112 | 3/2011 |
| JP | 2011-045113 | 3/2011 |

* cited by examiner

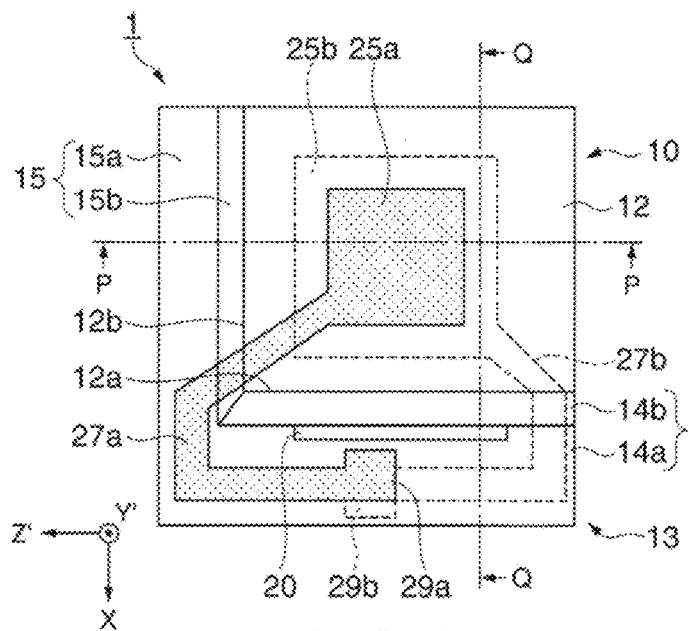
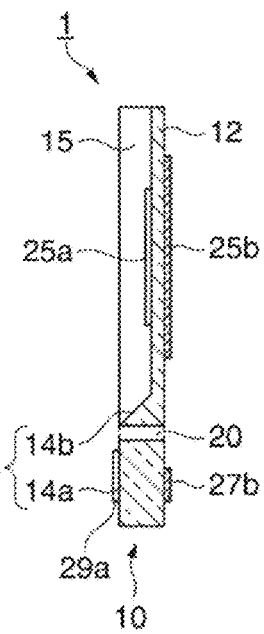
FIG. 1A
FIG. 1C
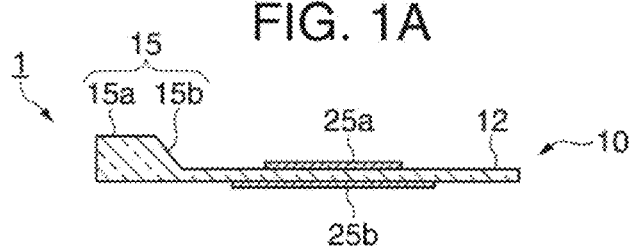
FIG. 1B
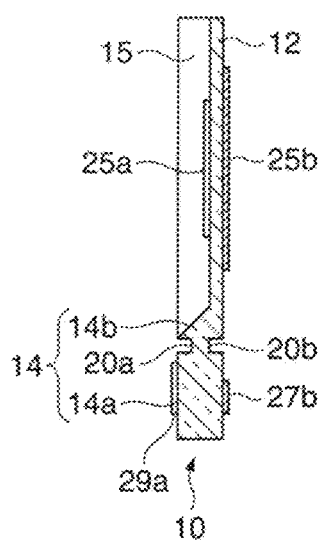
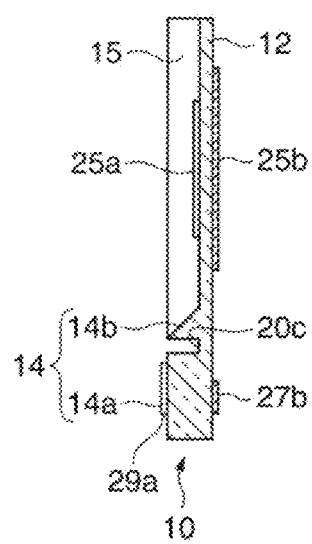
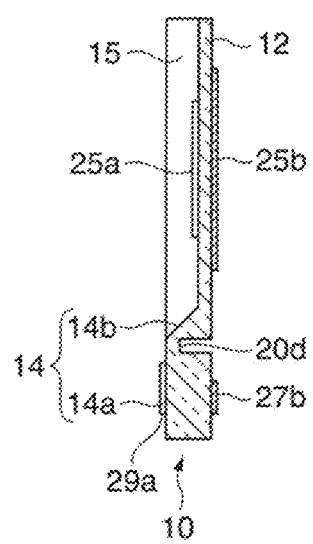
FIG. 1D   FIG. 1E   FIG. 1F

RESONATING ELEMENT, RESONATOR, ELECTRONIC DEVICE, ELECTRONIC APPARATUS, AND MOBILE OBJECT

BACKGROUND

1. Technical Field

The present invention relates to a resonator having a thickness shear vibration mode as the main vibration, and particularly to a vibrating element having a so-called inverted mesa structure, a resonator, and an electronic device, an electronic apparatus, and a mobile object using such a resonator.

2. Related Art

An AT cut quartz crystal resonator is a resonator in which the main vibration mode which is excited is a thickness shear vibration, and since it is appropriate for miniaturization and increases in frequency, and presents a cubic curve with an excellent frequency-temperature characteristic, it has a wide variety of applications in piezoelectric oscillators and electronic apparatuses.

JP-A-2004-165743 (patent literature 1) discloses an AT cut quartz crystal resonator of a so-called inverted mesa structure that includes a recess on a portion of the main plane and is designed to achieve high frequency. The length of the Z'-axis direction of a quartz crystal substrate is set to be longer than the length of the X-axis direction, and a so-called Z'-long substrate is used.

JP-A-2009-164824 (patent literature 2) discloses an AT cut quartz crystal resonator of an inverted mesa structure in which thick support sections (thick sections) are continuously formed respectively on three sides of a thin rectangular vibrating section and one side of the thin vibrating section is configured to be exposed. Furthermore, a quartz crystal resonator element is an in-plane rotation AT cut quartz crystal substrate in which the X-axis and the Z'-axis of the AT cut quartz crystal substrate is rotated in the range of −120° to +60° around the Y'-axis respectively, and has a structure (multi-cavity structure) excellent in securing a vibration area and mass-production.

JP-A-2006-203700 (patent literature 3) and JP-A-2002-198772 (patent literature 4) disclose an AT cut quartz crystal resonator of an inverted mesa structure in which thick support sections are continuously formed respectively on three sides of a thin rectangular vibrating section and one side of the thin vibrating section is configured to be exposed, and in a quartz crystal resonator element, the length of a quartz crystal substrate in the X-axis direction is longer than the length thereof in the Z'-axis direction, and a so-called X-long substrate is used.

JP-A-2002-033640 (patent literature 5) discloses an AT cut quartz crystal resonator of an inverted mesa structure in which thick support sections are continuously formed respectively on two adjacent sides and a thick section having an L-shape in a plan view is provided in a thin rectangular vibrating section, and two sides of the thin vibrating section are configured to be exposed. In a quartz crystal substrate, a Z'-long substrate is used.

However, in JP-A-2002-033640 (patent literature 5), in order to obtain the L-shaped thick section, the thick section is cut out along a line α and a line β as described in FIGS. 1C and 1D of JP-A-2002-033640, but since cutting is performed on the premise of cutting using a mechanical process such as dicing, or the like, there are problems in that damage such as chipping, cracking, or the like is inflicted on a cut surface, and an ultra-thin section is broken. In addition, other problems occur such as the generation of unwanted vibration that may cause spurious vibrations in a vibration area, an increase of a CI value, or the like.

JP-A-2001-144578 (patent literature 6) discloses an AT cut quartz crystal resonator of an inverted mesa structure in which a thick support section is continuously formed on one side only of a thin vibrating section and three sides of the thin vibrating section are configured to be exposed.

JP-A-2003-264446 (patent literature 7) discloses an AT cut resonator of an inverted mesa structure that is designed to achieve high frequency by forming a recess so as to oppose both main planes that are front and rear surfaces of a quartz crystal substrate. For the quartz crystal substrate, an X-long substrate is used, and a configuration is proposed in which excitation electrodes are provided in regions where flatness of a vibration area formed in the recess is secured.

With regard to a thickness shear vibration mode in which excitation is shown in a vibration area of an AT cut quartz crystal resonator, it is known that the vibration displacement distribution has an ellipsoidal shape having a long diameter in the X-axis direction due to anisotropy of an elastic constant. JP-A-2-079508 (patent literature 8) discloses a piezoelectric resonator in which a thickness shear vibration is excited with a pair of ring-shaped electrodes arranged on both the front and rear surfaces of a piezoelectric substrate so as to be symmetric in terms of front and rear sides. The difference between an outer circumferential diameter and an inner circumferential diameter of the ring-shaped electrodes is set so that the ring-shaped electrodes are excited only in a symmetric zero-order mode and seldom excited in other inharmonic higher-order modes.

JP-A-9-246903 (patent literature 9) discloses a piezoelectric resonator in which the shapes of a piezoelectric substrate and excitation electrodes provided on the front and rear surfaces of the piezoelectric substrate is set to be ellipsoidal shapes.

JP-A-2007-158486 (patent literature 10) discloses a quartz crystal resonator in which the shapes of both ends of a quartz crystal substrate in the long side direction (X-axis direction) and both ends of electrodes in the X-axis direction are set to be semi-elliptical shapes, and the ratio of the major axis to the minor axis (major axis/minor axis) of the ellipse is set to 1.26.

JP-A-2007-214941 (patent literature 11) discloses a quartz crystal resonator in which elliptical excitation electrodes are formed on an elliptical quartz crystal substrate. The ratio of the major axis to the minor axis is desirably 1.26:1, but when unevenness in manufacturing dimensions, or the like is considered, a ratio in the range of about 1.14 to 1.39:1 is effective.

JP-UM-A-61-187116 (patent literature 12) discloses a piezoelectric resonator that is configured to include a cutout or a slit between a vibrating section and a support section so as to further improve the energy trapping effect of a thickness shear piezoelectric resonator.

When miniaturization of a piezoelectric resonator is designed to achieve, there is a case where deterioration in electric characteristics or degradation of a frequency aging characteristic are caused due to residual stress caused by an adhesive. JP-A-9-326667 (patent literature 13) discloses a quartz crystal resonator in which a cutout or a slit is provided between a vibrating section and a support section of a flat rectangular AT cut quartz crystal resonator. It is said that the use of such a configuration can hinder residual stress from expanding to a vibration area.

JP-A-2009-158999 (patent literature 14) discloses a resonator in which a cutout or a slit is provided between a vibrating section and a support section of an inverted mesa type piezoelectric resonator in order to ease (alleviate) mounting strain (stress).

JP-A-2004-260695(patent literature 15) discloses a piezoelectric resonator in which conduction of electrodes on the front and rear surfaces is secured by providing a slit (through hole) in a support section of an inverted mesa type piezoelectric resonator.

JP-A-2009-188483 (patent literature 16) discloses a quartz crystal resonator that suppresses a higher-order contour unwanted mode by providing a slit in a support section of a thickness shear vibration mode AT cut quartz crystal resonator.

In addition, JP-A-2003-087087 (patent literature 17) discloses a resonator that suppresses spurious vibrations by providing a slit in a continuous section of a thin vibrating section and a thick holding section, in other words, in a residual section having an inclined surface, of an inverted mesa type AT cut quartz crystal resonator.

In recent years, demand for miniaturization, high frequency, and high performance of a piezoelectric device has intensified. However, when miniaturization and high frequency are intended, it is clear that there is a problem in that, with regard to a piezoelectric resonator of the above-described configuration, a CI value of the main vibration, a ratio of CI values of proximate spurious vibrations (=CIs/CIm, wherein CIm is a CI value of the main vibration, and CIs is a CI value of spurious vibrations, and a standard example is 1.8 or higher) and the like do not satisfy the demands. Particularly, when a frequency is a high frequency of several hundred MHz, the thickness of an electrode film of an excitation electrode formed in a piezoelectric vibration element and a lead electrode are problematic. When only the main vibration of the piezoelectric vibration element is intended to be in a trapping mode, there are problems in that the electrode film is thin, ohmic loss arises, and the CI value of the piezoelectric vibrating element increases.

In addition, when the thickness of the electrode film is thickened in order to prevent ohmic loss of the film, there is a problem in that many inharmonic modes other than the main vibration are shifted to trapping modes, and thus, the ratio of CI values of proximate spurious vibrations is not attained.

SUMMARY

An advantage of some aspects of the invention is to provide a piezoelectric vibrating element, a piezoelectric resonator, and an electronic device that achieve high frequency (100 to 500 MHz), reduce the CI value of the main vibration, and satisfy electronic demand such as the ratio of the CI value of spurious vibrations, and an electronic apparatus using such a piezoelectric resonator according to the aspect of the invention.

Application Example 1

This application example is directed to a piezoelectric vibrating element having: a substrate that includes a vibrating section including a vibration area and a thick section that is formed integrally with the vibrating section and is thicker than the vibrating section; and an excitation electrode that is provided in the vibration area, in which the thick section includes a first thick section that is provided along one side of the vibrating section, and a second thick section that is provided along another side connected to the above side, the first thick section and the second thick section are continuous with each other at respective end thereof, a main plane of the first thick section protrudes further than one main plane of the vibrating section, the other main plane of the first thick section and the other main plane of the vibrating section are the same plane, one main plane of the second thick section protrudes further than one main plane of the vibrating section, the other main plane of the second thick section and the other main plane of the vibrating section are the same plane, the first thick section includes a first inclined section of which the thickness increases as the first thick section is apart from one circumferential edge thereof that comes into continuous contact with a first outer edge of the vibrating section toward the other circumferential edge, and a first thick section main body that comes into continuous contact with the other circumferential edge of the first inclined section, and at least one slit is provided in the first thick section.

According to the configuration, a high-frequency piezoelectric vibrating element using a fundamental wave is miniaturized and easily mass-produced. Furthermore, since expansion of stress resulting from adhesion and fixation can be suppressed by providing a slit in the first thick section, there is an effect of obtaining a piezoelectric vibrating element having an excellent frequency-temperature characteristic, CI-temperature characteristic, and frequency aging characteristic. In addition, since excitation electrodes, lead electrodes, and pad electrodes respectively use metal materials of different compositions, and are configured to have proper film thicknesses, there is an effect of obtaining a piezoelectric vibrating element having a small CI value of the main vibration and a high ratio of a CI value of proximate spurious vibrations to the CI value of the main vibration, that is, a high CI value ratio.

Application Example 2

This application example is directed to the piezoelectric vibrating element according to the above application example, wherein, centering around an X axis of an orthogonal coordinate system including the X axis as an electrical axis, a Y axis as a mechanical axis, and a Z axis as an optical axis that are crystal axes of quartz crystal, the substrate sets an axis obtained by inclining the Z axis toward the −Y direction of the Y axis to a Z' axis, sets an axis obtained by inclining the Y axis toward the +Z direction of the Z axis to a Y' axis, has a plane including the X axis and the Z' axis as the main plane, and is a quartz crystal substrate having thickness in the direction along the Y' axis.

By configuring a piezoelectric vibrating element using such a piezoelectric substrate cut out at a cutting angle, there is an effect of obtaining a high-frequency piezoelectric vibrating element with required specifications that is configured at a more proper cutting angle having a frequency-temperature characteristic conforming to the specifications, a low CI value, and a high CI value ratio.

Application Example 3

This application example is directed to the piezoelectric vibrating element according to the above application example, wherein the first thick section and the second thick section protrude in the +Y direction of the Y' axis.

By including a first and a second thick sections in this manner, there are advantages of avoiding strain to be imposed on a vibrating section and fixing a piezoelectric vibrating element to a package.

Application Example 4

This application example is directed to the piezoelectric vibrating element according to the above application example, wherein the second thick section is provided in the +Z' direction of the Z' axis.

By including a second thick section in this manner, the strength of a vibrating section can be maintained even after two-step inclination generated by etching in the −Z' direction of the Z' axis is removed, and therefore, there is an advantage that a piezoelectric vibrating element can be fixed to a package.

Application Example 5

This application example is directed to the piezoelectric vibrating element according to the above application example, wherein the first thick section is provided in the +X direction of the X axis.

By including a first thick section in this manner, inclination generated by etching in the +X direction of the X axis becomes long, and therefore, there are advantages of avoiding strain imposed on a vibrating section and fixing a piezoelectric vibrating element to a package.

Application Example 6

This application example is directed to the piezoelectric vibrating element according to the above application example, wherein the slit is provided in the first thick section main body along the boundary section of the first inclined section and the first thick section main body.

According to the configuration, since a piezoelectric vibrating element is miniaturized and a slit is provided along the boundary section of the first inclined section and the first thick section main body, the expansion of stress arising during adhesion and fixation of the piezoelectric vibrating element can be suppressed. Accordingly, there is an effect of obtaining a piezoelectric vibrating element having excellent frequency-temperature characteristic, CI (Crystal Impedance)-temperature characteristic, and frequency aging characteristic.

Application Example 7

This application example is directed to the piezoelectric vibrating element according to the above application example, wherein the slit is provided within the first inclined section as being separated from one side of the vibrating section.

According to the configuration, since a piezoelectric vibrating element is miniaturized and a slit is provided within the first inclined section as being separated from one side of the vibrating section, the slit can be easily formed and the expansion of stress arising during adhesion and fixation of the piezoelectric vibrating element can be suppressed. Accordingly, there is an effect of obtaining a piezoelectric vibrating element having excellent frequency-temperature characteristic, and CI-temperature characteristic.

Application Example 8

This application example is directed to the piezoelectric vibrating element according to the above application example, wherein the slit includes a first slit disposed in the first thick section main body, and a second slit that is provided within the first inclined section as being separated from one side of the vibrating section.

According to the configuration, since a piezoelectric vibrating element is miniaturized and two slits are provided in the first thick section, the expansion of stress arising during adhesion and fixation of the piezoelectric vibrating element can be suppressed. Accordingly, there is an effect of obtaining a piezoelectric vibrating element having excellent frequency reproducibility, frequency-temperature characteristic, CI-temperature characteristic, and frequency aging characteristic.

Application Example 9

This application example is directed to the piezoelectric vibrating element according to the above application example, wherein the first slit is provided in the first thick section main body along the boundary section of the first inclined section and the first thick section main body.

In this manner, since the first slit is provided along the boundary section of the first inclined section and the first thick section main body, there is an effect of further suppressing the expansion of stress arising during adhesion and fixation of the piezoelectric vibrating element.

Application Example 10

This application example is directed to a piezoelectric resonator including: the piezoelectric vibrating element according to the above application example; and a package in which the piezoelectric vibrating element is accommodated.

According to the configuration, as a high-frequency piezoelectric vibrating element is miniaturized and stress resulting from adhesion and fixation of the piezoelectric vibrating element can be reduced, there is an effect of obtaining a piezoelectric resonator having excellent frequency reproducibility, frequency-temperature characteristic, CI-temperature characteristic, and frequency aging characteristic. Furthermore, since excitation electrodes, lead electrodes, and pad electrodes respectively use metal materials of different compositions, and are configured to have proper film thicknesses, there is an effect of obtaining a piezoelectric resonator having a small CI value of the main vibration and a high ratio of a CI value of proximate spurious vibrations to the CI value of the main vibration, that is, a high CI value ratio, and a piezoelectric resonator having a small capacitance ratio.

Application Example 11

This application example is directed to an electronic device including: the piezoelectric vibrating element according to Application Example 1; an electronic component; and a package in which the piezoelectric vibrating element and the electronic component are accommodated.

In this manner, if an electronic device in which a package accommodates a piezoelectric vibrating element and an electronic component is configured, when a thermistor is applied to the electronic component, for example, the thermistor of a temperature-sensing element is disposed very close to the piezoelectric vibrating element, and therefore, there is an effect of swiftly sensing a temperature change of the piezoelectric vibrating element. In addition, by building the electronic component therein, there is an effect of reducing load on an apparatus by adding a temperature control function to the apparatus to be used.

Application Example 12

This application example is directed to the electronic device according to the above application example, wherein the electronic component is any one of a variable capacitance element, a thermistor, an inductor, and a capacitor.

In this manner, if an electronic device (piezoelectric device) is configured by using any one of a variable capacitance element, a thermistor, an inductor, and a capacitor in the electronic component, there is an effect of realizing an electronic device more suitable for a device with required specifications in a small size at low cost.

Application Example 13

This application example is directed to an electronic device according to the above application example including: a package in which the oscillator circuit for driving the piezoelectric vibrating element are accommodated.

According to the configuration, there is an effect of obtaining a high-frequency (for example, 490 MHz band) electronic device (piezoelectric device) in a small size having excellent frequency reproducibility, frequency-temperature characteristic, and frequency aging characteristic. In addition, since such a piezoelectric device uses a piezoelectric vibrating element of a fundamental mode, a capacitance ratio is low and a frequency variable width is wide. Furthermore, there is an effect of obtaining an electronic device (piezoelectric device) having a satisfactory S/N ratio.

In addition, there are effect of configuring a piezoelectric oscillator, a temperature-compensated piezoelectric oscillator, and the like as a piezoelectric device, and an electronic device (piezoelectric device) having excellent frequency reproducibility, frequency aging characteristic, and frequency-temperature characteristic.

Application Example 14

This application example is directed to an electronic apparatus including: the piezoelectric resonator according to Application Example 10.

According to the configuration, since the piezoelectric resonator of the above application example is used in an electronic apparatus, there is an effect of configuring an electronic apparatus having excellent frequency stability at a high frequency and including a reference frequency source with a satisfactory S/N ratio.

Application Example 15

This application example is directed to a mobile object including: the piezoelectric resonator according to Application Example 10.

According to the configuration, since the piezoelectric resonator of the above application example is used in a mobile object, there is an effect of configuring a mobile object having excellent frequency stability at a high frequency and including a reference frequency source with a satisfactory S/N ratio.

BRIEF DESCRIPTION OF THE DRAWINGS

The invention will be described with reference to the accompanying drawings, wherein like numbers reference like elements.

FIGS. 1A to 1F are schematic diagrams showing a configuration of a piezoelectric vibrating element according to a first embodiment of the invention. FIG. 1A is a plan view, FIG. 1B is a cross-sectional view of line P-P, FIG. 1C is a cross-sectional view of line Q-Q, FIGS. 1D, 1E, and 1F are cross-sectional view of line Q-Q showing modification examples of a slit shape.

FIG. 6A is a plan view, FIG. 6B is a cross-sectional view of line P-P, and FIG. 6C is a cross-sectional view of line Q-Q.

FIG. 7A is a plan view, FIG. 7B is a cross-sectional view of line P-P, and FIG. 7C is a cross-sectional view of line Q-Q.

FIG. 26A is a plan view thereof, FIG. 26B is an enlarged view of the main sections, and FIG. 26C is a cross-sectional view of the main sections.

DESCRIPTION OF EXEMPLARY EMBODIMENTS

Figure 2:
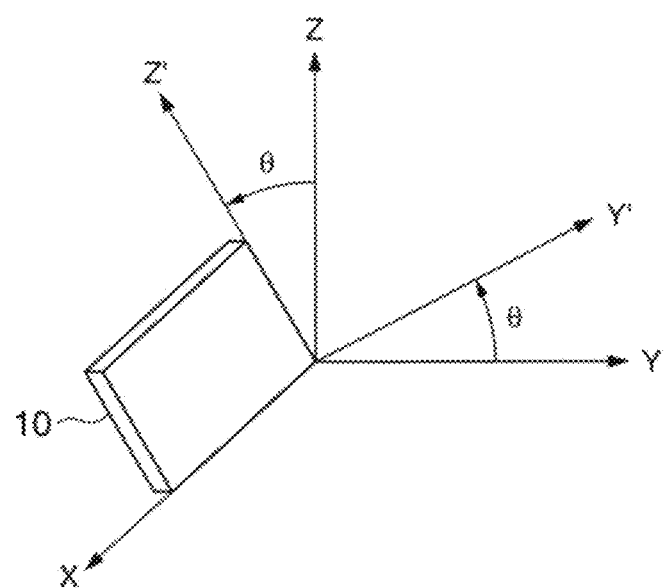
FIG. 2 is a diagram describing the relationship between an AT cut quartz crystal substrate and crystal axes.

Hereinafter, embodiments of the invention will be described in detail with reference to the drawings.

First Embodiment

FIGS. 1A to 1F are schematic diagrams showing a configuration of a piezoelectric vibrating element 1 according to a first embodiment of the invention. FIG. 1A is a plan view of the piezoelectric vibrating element 1, FIG. 1B is a cross-sectional view of cross-section P-P taken from the +X-axis direction, FIG. 1C is a cross-sectional view of cross-section Q-Q taken from the −Z'-axis direction, FIGS. 1D, 1E, and 1F are cross-sectional view of cross-section Q-Q showing modification examples of a slit shape.

The piezoelectric vibrating element 1 includes a vibrating section 12 that includes a thin rectangular vibration area, a piezoelectric substrate 10 that is formed integrally with the vibrating section 12 and has a thick section 13 of which the thickness is greater than that of the vibration area, excitation electrodes 25a and 25b that are respectively disposed on the front and rear surfaces of the vibration area so as to oppose each other, and lead electrodes 27a and 27b that are provided respectively extending from each of the excitation electrodes 25a and 25b to pad electrodes 29a and 29b provided in the thick section 13.

Herein, the piezoelectric substrate 10 includes the vibrating section 12 including the vibration area and the circumferential edge and the thick section 13. In addition, the ratio between the dimensions of the vibrating section 12 in the X-axis direction and the dimensions of the vibrating section 12 in the Z'-axis direction is 1.26:1 as is known.

In addition, the vibrating area is the area in which the vibrating energy is trapped, and the circumferential edge is the circumferential area of the vibrating area in the vibrating section 12.

The piezoelectric substrate 10 is a rectangular shape, and includes the vibrating section 12 that is thin and plate-like, a first thick section 14 that is disposed along a side 12a that is one side of the four sides of the vibrating section 12, and a second thick section 15 that is disposed along a side 12b that is another side adjoining the side 12a of the vibrating section 12. In other words, the piezoelectric substrate 10 includes an L-shaped thick section (thick support section) 13 (the first thick section 14 and the second thick section 15) integrally formed along the adjoining sides 12a and 12b of the vibrating section 12.

The first thick section 14 includes a first inclined section 14b that is continuously formed from the side 12a of the vibrating section 12 and of which the thickness gradually increases as the first inclined section is separated beginning from one edge (inner edge) coming into continuous contact with the side 12a of the vibrating section 12 toward the other edge (outer edge) and a first thick section main body 14a of a thick quadrangle column shape coming into continuous contact with the other edge (outer edge) of the first inclined section 14b.

In the same manner, the second thick section 15 includes a second inclined section 15b that is continuously formed from the side 12b of the vibrating section 12 and of which the thickness gradually increases as the second inclined section is separated beginning from one edge (inner edge) coming into continuous contact with the side 12b of the vibrating section 12 toward the other edge (outer edge) and a second thick section main body 15a of a thick quadrangle column shape coming into continuous contact with the other edge (outer edge) of the second inclined section 15b.

Furthermore, the first thick section main body 14a and the second thick section main body 15a are referred to areas with a fixed thickness in the Y'-axis direction.

Respective main planes (front surfaces) of the first thick section 14 and the second thick section 15 are formed further protruding than one main plane (front surface) of the vibrating section 12, and the other main plane (rear surface) of the vibrating section 12 and respective the other main planes (rear surfaces) of the first thick section 14 and the second thick section 15 are disposed on the same plane, in other words, a plane parallel with the X-Z' plane of the coordinate axis shown in FIGS. 1A to 1F. The above-described one main plane (front surface) is also called a recessed surface, and the other main plane (rear surface) is also called a flat surface (plane surface).

One main plane (front surface) of the first thick section 14 is formed further protruding than one main plane (front surface) of the vibrating section 12. In addition, the other main plane (rear surface) of the first thick section 14 comes into continuous contact with the other main plane (rear surface) of the vibrating section 12 so as to form the same surface. Furthermore, even when there is an energy trapped region protruding from the mesa in the vibration area, it may be preferable that the other main plane (rear surface) of the circumferential edge comes into continuous contact with the other main plane of the first thick section 14 so as to form the same surface.

One main plane (front surface) of the second thick section 15 is formed further protruding than one main plane (front surface) of the vibrating section 12. In addition, the other main plane (rear surface) of the second thick section 15 comes into continuous contact with the other main plane (rear surface) of the vibrating section 12 so as to form the same surface. Furthermore, even when there is an energy trapped region protruding from the mesa in the vibration area, it may be preferable that the other main plane (rear surface) of the circumferential edge comes into continuous contact with the other main plane of the second thick section 15 so as to form the same surface.

In this way, the first thick section 14 is provided in the +X direction on the X-axis, and the second thick section 15 is provided in the Z' direction on the Z'-axis.

In the first thick section 14, at least one slit 20 for easing stress accompanied by mounting of the piezoelectric vibrating element 1 is formed between the vibrating section 12 and the pad electrodes 29a and 29b extending along the Z'-axis direction so as to penetrate in the Y'-axis direction. In the embodiment shown in FIGS. 1A to 1F, the slit 20 is formed in the inner side of a surface of the first thick section main body 14a along the boundary (contact portion) of the first inclined section 14b and the first thick section main body 14a. In other words, the slit 20 is formed surrounded by the first thick section main body 14a.

Furthermore, the slit 20 is not limited to one formed in a penetrating manner as shown in FIG. 1C, and may be a groove-like slit having a bottom. To describe such a groove-like slit in more detail, as shown in FIG. 1D, for example, it may be configured as slits provided in both front and rear surfaces as a first slit 20a that is formed from the front surface side of the first thick section main body 14a having a bottom and a second slit 20b that is formed from the rear surface side of the first thick section main body 14a having a bottom.

In addition, as shown in FIG. 1E, it may be configured as a third slit 20*c* that is formed from the front surface side of the first thick section main body 14*a* having a bottom. In addition, as shown in FIG. 1F, it may be configured as a fourth slit 20*d* that is formed from the rear surface side of the first thick section main body 14*a* having a bottom.

In addition, the thickness of the bottoms of the slits 20*a*, 20*b*, 20*c*, and 20*d* may be thicker or thinner than the thickness of the vibrating section 12.

The shape of the slit 20 (20*a*, 20*b*, 20*c*, and 20*d*) described herein can be applied to other embodiments, modification examples, and application examples to be described below.

The piezoelectric substrate 10 is a quartz crystal substrate of which a piezoelectric material belongs to a trigonal system, and has crystal axes X, Y, and Z orthogonal to one another as shown in FIG. 2. The X axis, Y axis, and Z axis are respectively referred to as an electrical axis, a mechanical axis, and an optical axis. In addition, with regard to the quartz crystal substrate, a plate cut out from quartz crystal along a plane obtained by rotating the X-Z plane around the X axis by a predetermined angle of θ, that is, a plate of a rotation Y cut quartz crystal substrate is used for a piezoelectric vibrating element. When the rotation Y cut quartz crystal substrate is an AT cut quartz crystal substrate, for example, the angle θ is about 35° 15'. Furthermore, respective Y' axis and Z' axis are obtained by rotating the Y axis and Z axis around the X axis by θ. Thus, the AT cut quartz crystal substrate has crystal axes X, Y', and Z' orthogonal to one another. In addition, the thickness direction is the Y' axis, the X-Z' plane (a plane including the X and Z' axes) orthogonal to the Y' axis is the main plane, and thickness shear vibration is excited as the main vibration.

In other words, when an axis obtained by inclining the Z axis toward the −Y direction of the Y axis is set to be the Z' axis and an axis obtained by inclining the Y axis toward the +Z direction of the Z axis is set to be the Y' axis with respect to the X axis of the orthogonal coordinate system including the X axis (electrical axis), the Y axis (mechanical axis), and the Z axis (optical axis) as shown in FIG. 2, the piezoelectric substrate 10 is an AT cut quartz crystal substrate including a plane parallel to the X axis and the Z' axis and having thickness in the direction parallel to the Y' axis.

As shown in FIG. 1A, the piezoelectric substrate 10 has a rectangular shape with a thickness in the direction parallel to the Y' axis (hereinafter, referred to as the "Y'-axis direction"), a long side in the direction parallel to the X axis (hereinafter, referred to as the "X-axis direction"), and a short side in the direction parallel to the Z' axis (hereinafter, referred to as the "Z'-axis direction").

Furthermore, the shape of the piezoelectric substrate 10 is not limited to a rectangle, and may be a square, or other quadrangle, or a polygon including a pentagon or one having more number of sides. In addition, one side of the vibrating section is not limited to a straight line, and may be one including a curve, and when the external shape of the vibrating section is a polygon, at the corner between the one side and another side connected thereto, another side may be provided.

In addition, the piezoelectric substrate according to the embodiment of the invention is not limited to AT cut with the angle θ of about 35° 15', and it is needless to say that the invention can be broadly applied to a piezoelectric substrate of BT cut, or the like, in which thickness shear vibration is excited.

The excitation electrodes 25*a* and 25*b* for driving the piezoelectric substrate 10 are quadrangle shapes in the embodiment shown in FIGS. 1A to 1F, and formed on both front and rear surfaces (both upper and lower surfaces) substantially at the center of the vibrating section 12 so as to oppose each other via the piezoelectric substrate 10. The size of the excitation electrode 25*b* in the rear surface (flat surface) side is set to be sufficiently larger than the size of the excitation electrode 25*a* in the front surface (recessed surface) side. This is for not setting an energy trapping coefficient according to a mass effect of the excitation electrodes 25*a* and 25*b* to be higher than necessary. In other words, by setting the excitation electrode 25*b* in the rear surface (flat surface) side to be sufficiently large, a plate back amount Δ (=(fs−fe)/fs, wherein fs is a cut-off frequency of the piezoelectric substrate and fe is a frequency when an excitation electrode is attached on the entire surface of the piezoelectric substrate) depends only on the mass effect of the excitation electrode 25*a* in the front surface (upper surface) side.

The excitation electrodes 25*a* and 25*b* are formed in such a way of, for example, forming a film with nickel (Ni) on a base and then forming a film with gold (Au) thereon in an overlapping manner, using a vapor deposition device, a sputtering device, or the like. With regard to the thickness of gold (Au), it is desirable that only the main vibration (S0) is set to be in a trapping mode, and oblique symmetric inharmonic modes (A0, A1, . . . ) and symmetric inharmonic modes (S1, S3, . . . ) are set not to be in a trapping mode in a range where ohmic loss does not increase. However, if the films are formed so as to avoid ohmic loss of the electrode film thickness in an attempt to configure a piezoelectric vibrating element of an extremely high frequency band of 490 MHz, shifting a low-order inharmonic mode to a trapping mode cannot be avoided.

The lead electrode 27*a* formed on the front surface side extending from the excitation electrode 25*a* is conductively connected to the pad electrode 29*a* formed on the front surface of the first thick section main body 14*a* via the second inclined section 15*b* and the second thick section main body 15*a* starting on the front surface of the vibrating section 12. In addition, the lead electrode 27*b* formed on the rear surface side extending from the excitation electrode 25*b* is conductively connected to the pad electrode 29*b* formed on the rear surface of the first thick section main body 14*a* via the circumferential edge on the rear surface of the piezoelectric substrate 10.

The embodiment shown in FIG. 1A is an example of a pull-out configuration of the lead electrodes 27*a* and 27*b*, and the lead electrode 27*a* may pass through other thick section. However, the lengths of the lead electrodes 27*a* and 27*b* are desirable to be the shortest, and it is desirable to consider the lead electrodes 27*a* and 27*b* not intersecting each other when interposing the piezoelectric substrate 10 so that an increase of electrostatic capacity is suppressed.

In addition, the embodiment shown in FIGS. 1A to 1F shows an example in which respective pad electrodes 29*a* and 29*b* are formed opposing the front and rear surfaces of the piezoelectric substrate 10. When the piezoelectric vibrating element 1 is contained in a package, the piezoelectric vibrating element 1 is turned over, the pad electrode 29*a* is mechanically fixed and electrically connected to an element-mounting pad of the package with a conductive adhesive, and the pad electrode 29*b* is electrically connected to an electrode terminal of the package by using a bonding wire, as described below. In this way, if a portion supporting the piezoelectric vibrating element 1 is set at one point, it is possible to reduce stress caused by such a conductive adhesive.

The reason of providing the slit 20 between the vibrating section 12 and the pad electrodes 29*a* and 29*b* that are supported sections by the piezoelectric vibrating element 1 is to prevent the expansion of stress arising during hardening of the conductive adhesive.

In other words, when the piezoelectric vibrating element 1 is adhered and fixed to the package with the conductive adhesive, first, the conductive adhesive is applied to the pad electrode (supported section) 29a of the first thick section main body 14a and the electrode is mounted on an element-mounting pad of the package, or the like, and then weight is exerted thereon. The package is left at a high temperature for a predetermined time in order to harden the conductive adhesive. In a state of a high temperature, since both the first thick section main body 14a and the package extend, and the adhesive is temporarily softened, stress does not arise in the first thick section main body 14a. When the conductive adhesive is hardened, the first thick section main body 14a and the package is cooled and then the temperature returns to the normal temperature (25° C.), stress caused by the hardened conductive adhesive arises due to differences between the respective linear expansion coefficients of the conductive adhesive, the package, and the first thick section main body 14a. Stress expands from the first thick section main body 14a to the second thick section 15, and from the first inclined section 14b and the second inclined section 15b to the vibrating section 12. In order to prevent stress from expanding, the slit 20 for easing stress is provided.

In this way, since the slit 20 is disposed along the boundary (continuous contact portion) of the first inclined section 14b and the first thick section main body 14a, a large area of the pad electrode 29a of the first thick section main body 14a can be secured, and a diameter of the conductive adhesive to be applied can be set to be large. On the contrary, if the slit 20 is disposed closer to the pad electrode 29a of the first thick section main body 14a, the area of the pad electrode 29a becomes narrower, and a diameter of the conductive adhesive has to be set to be small. As a result, an absolute amount of conductive filler contained in the conductive adhesive is also reduced, conductivity deteriorates, a resonant frequency of the piezoelectric vibrating element 1 becomes unstable, whereby there is a concern that frequency fluctuation (generally referred to as F jump) tends to occur.

Therefore, it is preferable that the slit 20 be disposed along the boundary (continuous contact portion) of the first inclined section 14b and the first thick section main body 14a.

In order to obtain distribution of stress ($\propto$ strain) arising in the piezoelectric substrate 10, a simulation is conducted generally using a finite element method. As stress on the vibrating section 12 gets smaller, a piezoelectric vibrating element excellent in a frequency-temperature characteristic, frequency reproducibility, a frequency aging characteristic, and the like is obtained.

As the conductive adhesive, a silicon-based, an epoxy-based, a polyimide-based, a bismaleimide-based adhesive, or the like is generally used, but considering a frequency temporal change of the piezoelectric vibrating element 1 caused by degassing, a polyimide-based conductive adhesive was used.

Since the polyimide-based conductive adhesive is hard, the amount of generated stress can be reduced further by supporting one spot than by supporting two separate spots (two-point support). For this reason, the piezoelectric vibrating element 1 for a voltage controlled crystal oscillator (VCXO) of a high frequency band of 100 to 500 MHz, for example, 490 MHz employed the configuration of one spot support (one-point support).

In other words, as described below, the pad electrode 29a is mechanically fixed to and electrically connected to the element-mounting pad of the package using the conductive adhesive, and the other pad electrode 29b is electrically connected to the electrode terminal of the package using a bonding wire.

In addition, the external shape of the piezoelectric substrate 10 shown in FIGS. 1A to 1F is so-called X-long in which the length thereof in the X-axis direction is longer than the length thereof in the Z'-axis direction. With regard to this matter, stress arises when the piezoelectric substrate 10 is adhered and fixed with the conductive adhesive, or the like, however, as well-known, if a frequency change when pressure is exerted on both ends of the AT cut quartz crystal substrate in the X-axis direction is compared to a frequency change when the same pressure is exerted on both ends thereof in the Z'-axis direction, the frequency change when the pressure is exerted on both ends thereof in the Z'-axis direction is smaller. In other words, it is preferable that a support point be provided along the Z'-axis direction as the frequency change caused by stress is smaller.

Figure 3A:
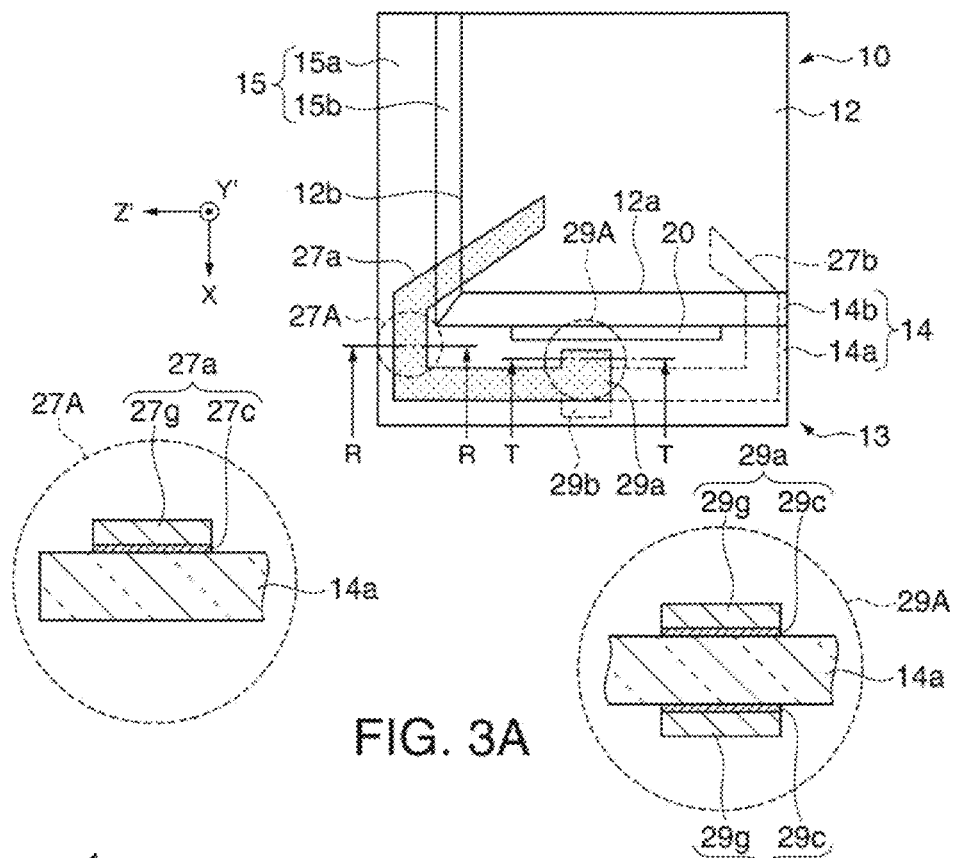
FIG. 3A is a plan view showing configurations of a lead electrode and a pad electrode.
Figure 3B:
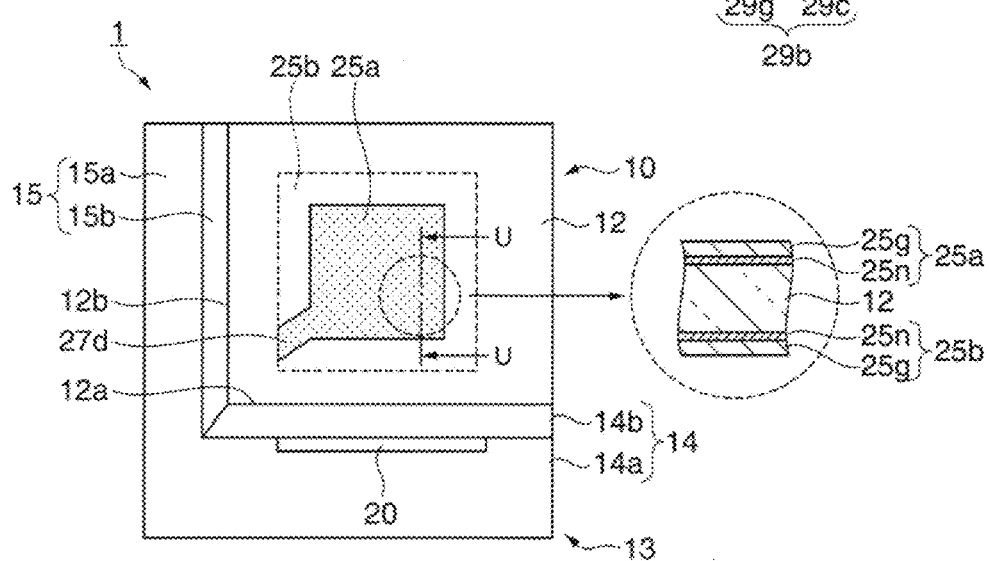
FIG. 3B is a plan view showing a configuration of an excitation electrode.

FIG. 3A is a plan view showing the disposition and configuration of the lead electrodes 27a and 27b and the pad electrodes 29a and 29b formed on the front and rear surfaces of the piezoelectric substrate 10, and FIG. 3B is a plan view showing the disposition and configuration of the excitation electrodes 25a and 25b.

On the front and rear surfaces of the piezoelectric substrate 10, the lead electrode 27a extends from the circumferential edge of the excitation electrode 25a that is assumed to be the front surface of the piezoelectric substrate 10 and passes through the front surface of the second thick section 15 so as to be formed continuous to the pad electrode 29a provided substantially at the center of the front surface of the first thick section main body 14a. In addition, the lead electrode 27b extends from the circumferential edge of the excitation electrode 25b that is assumed to be the rear surface of the piezoelectric substrate 10 along the circumference of the rear surface (flat surface) so as to be formed continuous to the pad electrode 29b provided substantially at the center of the rear surface of the first thick section main body 14a.

The lead electrodes 27a and 27b are respectively provided with a first layer composed of a thin film of chrome (Cr) and a second layer composed of a thin film of gold (Au) laminated on the upper surface of the first layer. A view taken by enlarging cross-section R-R of a part 27A of the lead electrode 27a is shown in the dashed circle 27A in the left side of FIG. 3A. The lead electrode 27a is configured such that a chromic thin film 27c on the front surface (upper surface) side of the first thick section main body 14a is set as a base and a gold thin film 27g is formed thereon in a laminating manner. The laminating manner for the lead electrode 27b is the same.

The pad electrodes 29a and 29b provided on the front and rear surfaces of the middle section of the first thick section main body 14a include a first layer being made of chromic (Cr) thin film and a second layer being made of the gold (Au) thin film which is laminated on the upper surface of the first layer. A enlarged cross-sectional view of cross-section T-T of a part 29A of the pad electrodes 29a and 29b, is shown in the broken line circle 29A of the middle lower section of the FIG. 3A. On the front surface side (upper surface side) of the first thick section main body 14a, the pad electrode 29a is configured by setting a chromic (Cr) thin film 29c as a base sheet and laminating a gold (Au) thin film 29g for film formation on thereof. The laminating manner for the pad electrode 29b is the same.

Since the lead electrodes 27a and 27b and the pad electrodes 29a and 29b are formed in the same process, as an example of the film thicknesses, the chromic (Cr) thin film of the first layer is formed to have the thickness of 100 Å (1 Å is 0.1 nm (nanometer)) and the gold thin film is formed to have the thickness of 2000 Å. For this reason, ohmic loss of the lead electrodes 27a and 27b and the pad electrodes 29a and 29b is not incurred, and bonding strength is also sufficient.

Furthermore, it may be configured to interpose other metal film between the chromic (Cr) thin film and the gold (Au) thin film.

FIG. 3B is a plan view showing the disposition and configuration of the excitation electrodes 25a and 25b formed on the piezoelectric substrate 10 so as to match the lead electrodes 27a and 27b formed in the previous process. The excitation electrode 25a is formed on the front surface side of the vibrating section 12, and the excitation electrode 25b is formed on the rear surface (flat surface) side so that the size thereof is sufficiently larger than that of the excitation electrode 25a and the excitation electrode 25a is settled in the area of the excitation electrode 25b.

Herein, in the formation of the excitation electrodes 25a and 25b, the excitation electrodes 25a and 25b are formed so as to overlap at least part of the lead electrodes 27a and 27b formed beforehand in the previous process. As shown in FIG. 3B, for example, the excitation electrode 25a has a part 27d of the lead electrode extending from an edge portion. The part 27d of the lead electrode is configured to overlap the front surface of the lead electrode 27a. With the configuration, the excitation electrode 25a can be assuredly electrically connected to the lead electrode 27a and accordingly, conduction failure can be prevented. The excitation electrode 25b formed on the rear surface (flat surface) side is configured in the same manner.

Alternatively, a part of the lead electrode 27b formed beforehand in the previous process may be formed so as to enter (overlap) the area of the excitation electrode 25b. In this case, since a plate back amount used for determining a resonance frequency depends only on a mass effect of the excitation electrode 25a formed on one main plane that is the front surface side of the vibrating section 12, a part of the lead electrode 27b is configured to be positioned on the outer circumference side than the external shape of the excitation electrode 25a so that the part thereof does not overlap in a plan view while interposing the piezoelectric substrate 10 with the excitation electrode 25a and thereby not changing the plate back amount from the designed value.

In an example of a configuration of the excitation electrodes 25a and 25b, a first layer composed of a thin film of nickel (Ni) and a second layer composed of a thin film of gold (Au) laminated on the upper surface of the first layer are provided. Part of the excitation electrodes 25a and 25b in cross-section U-U in the dashed circle is shown in the dashed circle of the right side in FIG. 3B. On the front and rear surfaces of the vibrating section 12, thin films 25n of nickel (Ni) are formed as first layers and thin films 25g of gold (Au) are formed as second layers in a laminating manner. As an example of the film thickness, the nickel (Ni) film thickness of as the first layer is 70 Å, and the gold (Au) film thickness is 600 Å.

Furthermore, it may be configured to interpose other metal film between the nickel (Ni) thin film and the gold (Au) thin film.

The reason that the respective electrode materials and electrode thicknesses of the lead electrodes 27a and 27b and the pad electrodes 29a and 29b, and the excitation electrodes 25a and 25b are different from each other when a fundamental frequency of the vibrating section 12 of the piezoelectric substrate 10 is set to be 490 MHz that is an extremely high frequency band will be described below. Let us assume that the lead electrodes 27a and 27b, the pad electrodes 29a and 29b and the excitation electrodes 25a and 25b are configured to include, for example, a thin film of nickel (Ni) with 70 Å as a first layer and a thin film of gold (Au) with 600 Å as a second layer. The main vibration is sufficiently in a trapping mode, and crystal impedance (CI, equivalent resistance) thereof becomes small, but since the gold (Au) film thickness of the lead electrodes 27a and 27b is thin, there is concern that ohmic loss of the thin film occurs. Furthermore, if the pad electrodes 29a and 29b are formed of a nickel (Ni) thin film with 70 Å and a gold (Au) thin film with 600 Å, there is concern that insufficient strength of wire bonding occurs.

In addition, if the lead electrodes 27a and 27b, the pad electrodes 29a and 29b and the excitation electrodes 25a and 25b are composed of, for example, a thin film of chrome (Cr) with 70 Å as a first layer and a thin film of gold (Au) with 600 Å as a second layer, heat causes chrome (Cr) to diffuse into the thin film of gold (Au) as the thin film of gold (Au) is thin, resulting in ohmic loss of the thin film, and therefore, there is concern that a CI of the main vibration increases.

Thus, in the embodiment, formation processes of the lead electrodes 27a and 27b, the pad electrodes 29a and 29b and the excitation electrodes 25a and 25b are separated, and materials and film thicknesses of respective electrode thin films are set so as to be optimum for the functions of the respective thin films. In other words, for the excitation electrodes 25a and 25b, for example, the electrode film thicknesses were set to be as thin as 70 Å for nickel (Ni) and 600 Å for gold so that the main vibration is in the trapping mode, a proximate inharmonic mode is shifted to a propagation mode (non-trapping mode) as possible. On the other hand, for the lead electrodes 27a and 27b and the pad electrodes 29a and 29b, the film thickness of chrome (Cr) was set to be 100 Å and the film thickness of gold (Au) to be 2000 Å so that film resistance of a thin lead electrode is reduced, and the strength of bonding increases.

The above-described film thicknesses are examples, and the values are not limited. For the excitation electrodes 25a and 25b, the laminated films of nickel (Ni) and gold (Au) with the optimum film thickness are used in consideration of the energy trapping theory and ohmic loss of the thin film. In addition, for the lead electrodes 27a and 27b and the pad electrodes 29a and 29b, the laminated films of chrome (Cr) and gold (Au) with the necessary thickness are used in consideration of ohmic loss of the thin film and the strength of bonding.

A method for manufacturing the excitation electrodes 25a and 25b, the lead electrodes 27a and 27b, and the pad electrodes 29a and 29b will be described later.

Figure 4:
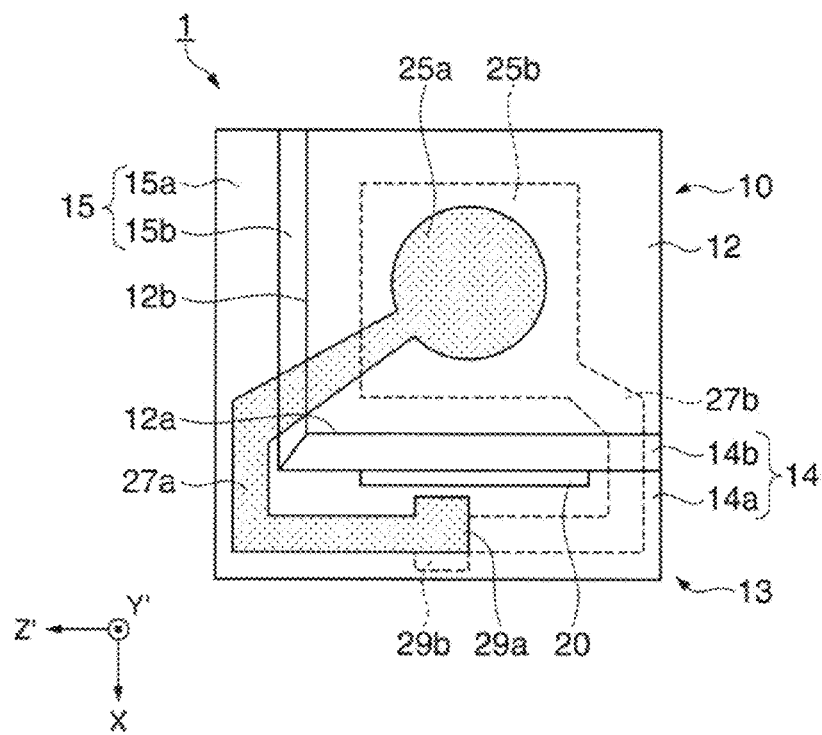
FIG. 4 is a plan view showing a configuration of a modification example of the piezoelectric vibrating element.

In an embodiment of FIGS. 1A to 1F, a quadrangle, that is a square or a rectangle (having a long side in the X-axis direction) is exemplified as the shape of the excitation electrodes 25a and 25b, but the shape is not limited hereto. In the example shown in FIG. 4, the excitation electrode 25a on the front surface side has a circular shape and the excitation electrode 25b on the rear surface side has a quadrangle shape of which the area is sufficiently larger than that of the excitation electrode 25a. Furthermore, the excitation electrode 25b on the rear surface side may have a circular shape of which the area is sufficiently large.

Figure 5:
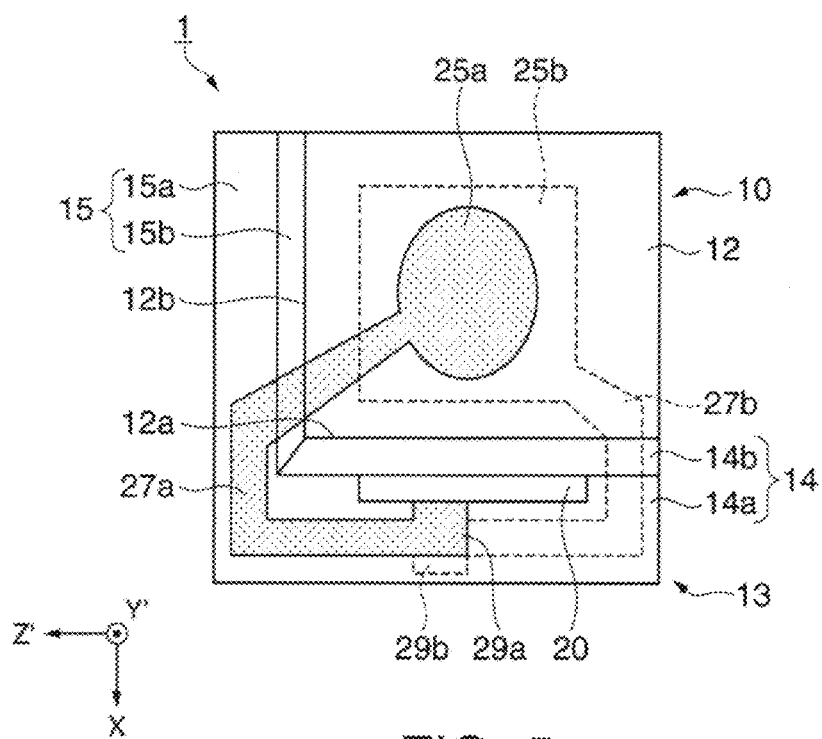
FIG. 5 is a plan view showing a configuration of another modification example of the piezoelectric vibrating element.

In an embodiment shown FIG. 5, the excitation electrode 25a on the front surface side has an elliptical shape and the excitation electrode 25b on the rear surface side has a quadrangle shape of which the area is sufficiently larger than that of the excitation electrode 25a. As quartz crystal has different displacement distributions in the X-axis direction and in the Z'-axis direction due to anisotropy of an elastic constant, a cut plane obtained by cutting displacement distribution by a plane parallel to the X-Z'plane is an elliptical shape. For this reason, when the excitation electrode 25a in an elliptical shape is used, the piezoelectric vibrating element 1 can be driven showing the highest efficiency. In other words, a capacity ratio 7 of the piezoelectric vibrating element 1 (=C0/C1, wherein C0 is electrostatic capacity, and C1 is series resonance capacity) can be set to the minimum level. In addition, the excitation electrode 25a may be an oval shape.

Second Embodiment

Figure 6A:
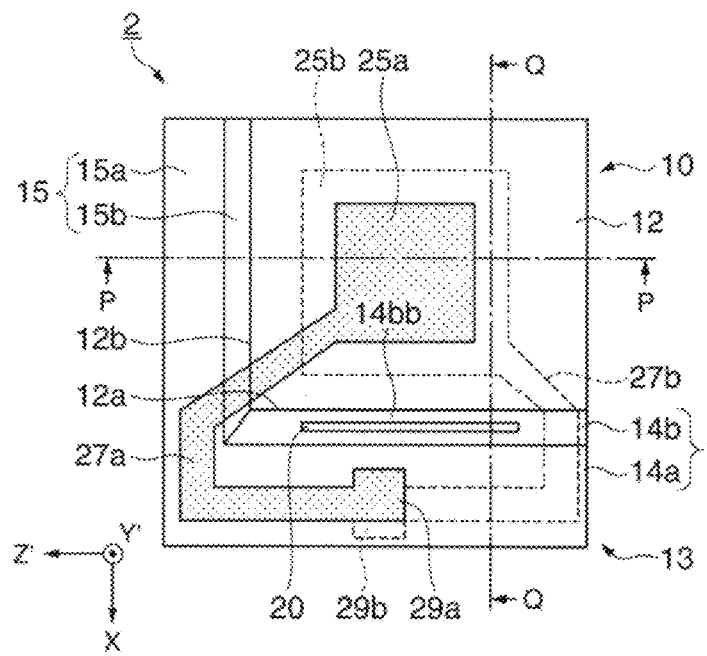
FIGS. 6A to 6C are schematic diagrams showing a configuration of a piezoelectric vibrating element according to a second embodiment of the invention.
Figure 6C:
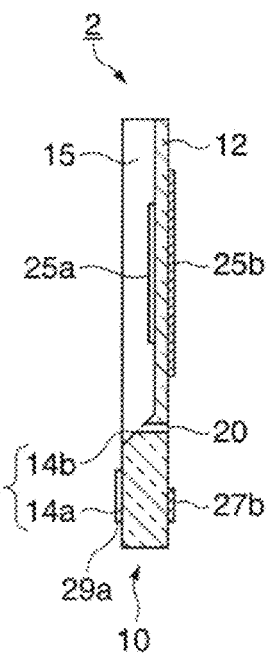
Figure 6B:
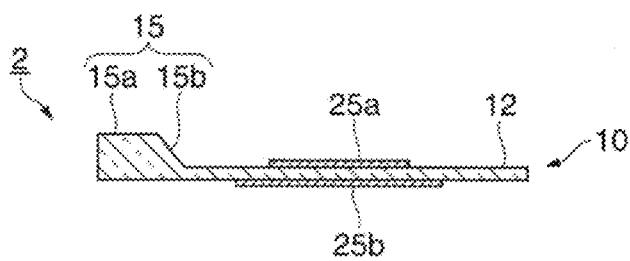

FIGS. 6A to 6C are schematic diagrams showing a configuration of a piezoelectric vibrating element 2 according to a second embodiment. FIG. 6A is a plan view of the piezoelectric vibrating element 2, FIG. 6B is a cross-sectional view of cross-section P-P taken from the +X-axis direction and FIG. 6C is a cross-sectional view of cross-section Q-Q taken from the −Z'-axis direction.

A difference of the piezoelectric vibrating element 2 from the piezoelectric vibrating element 1 shown in FIGS. 1A to 1F is the position where the slit 20 for easing stress is provided. In the present embodiment, the slit 20 is formed within the first inclined section 14b as being separated from the circumferential edge of the side 12a of the thin vibrating section 12. The slit 20 is not formed within the first inclined section 14b so that one circumferential edge of the slit 20 comes into contact with the side 12a along the side 12a of the vibrating section 12, but provided being separated from both circumferential edges of the first inclined section 14b. That is, in the first inclined section 14b, an extremely thin inclined section 14bb is left which comes into continuous contact with the circumferential edge of the side 12a of the vibrating section 12. In other words, the extremely thin inclined section 14bb is formed between the side 12a and the slit 20.

The reason of leaving the extremely thin inclined section 14bb is as follows. That is, if the vibrating section 12 is excited by applying high frequency voltage to the excitation electrodes 25a and 25b disposed in the vibrating section 12, inharmonic modes (A0, S1, A1, S2 . . . ) are excited in addition to the main vibration (S0). A desirable manner is to set a trapping mode only for the mode of the main vibration (S0) and a propagation mode (non-trapping mode) for other inharmonic modes. However, if the vibrating section 12 is thin and the fundamental frequency thereof is set to several hundred MHz, it is necessary to increase the thicknesses of the excitation electrodes 25a and 25b to a certain level in order to avoid ohmic loss of the electrode films. For this reason, when the thicknesses of the excitation electrodes 25a and 25b are set to a certain level or higher, a low-order inharmonic mode proximate to the main vibration is shifted to a trapping mode. As a result, the shapes of both circumferential edges of the vibrating section 12 of FIGS. 6A to 6C in the Z'-axis direction are asymmetric, and the shapes of both circumferential edges thereof in the X-axis direction are asymmetric, and accordingly, the amplitude of a stationary wave in a low-order inharmonic mode is suppressed.

Third Embodiment

Figure 7A:
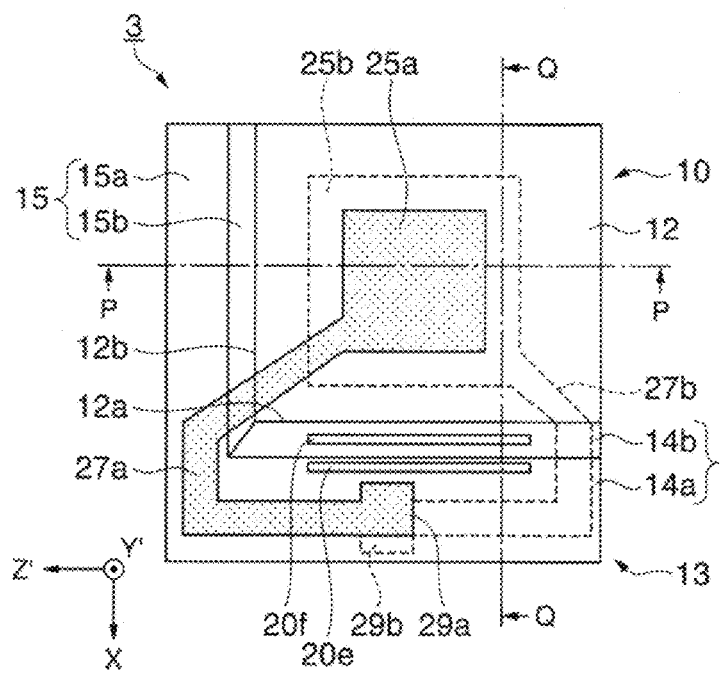
FIGS. 7A to 7C are schematic diagrams showing a configuration of a piezoelectric vibrating element according to a third embodiment of the invention.
Figure 7C:
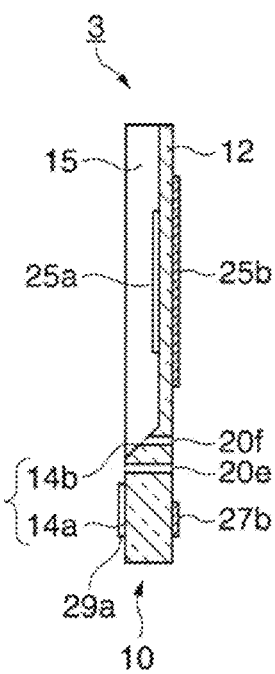
Figure 7B:
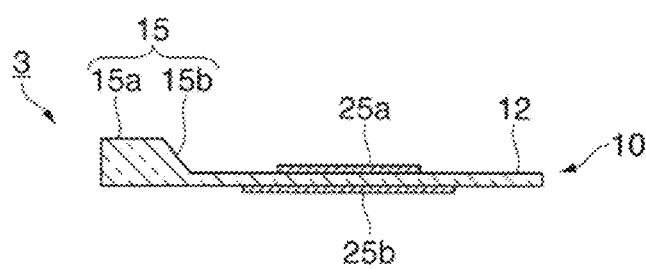

FIGS. 7A to 7C are schematic diagrams showing a configuration of a piezoelectric vibrating element 3 according to a third embodiment. FIG. 7A is a plan view of the piezoelectric vibrating element 3, FIG. 7B is a cross-sectional view of cross-section P-P taken from the +X-axis direction, and FIG. 7C is a cross-sectional view of cross-section Q-Q taken from the −Z'-axis direction.

A difference of the piezoelectric vibrating element 3 from the piezoelectric vibrating element 1 shown in FIGS. 1A to 1F is that two slits for easing stress are provided such that a first slit 20e is provided within a plane of the first thick section main body 14a and a second slit 20f is formed within a plane of the first inclined section 14b. The purpose of providing respective individual slits within the planes of the first thick section main body 14a and the first inclined section 14b is that, by providing two slits within the first thick section 14, expansion of stress arising during hardening of a conductive adhesive can be more effectively suppressed. Since the detail on the matter has already been described above, so it is omitted herein.

Figure 8A:
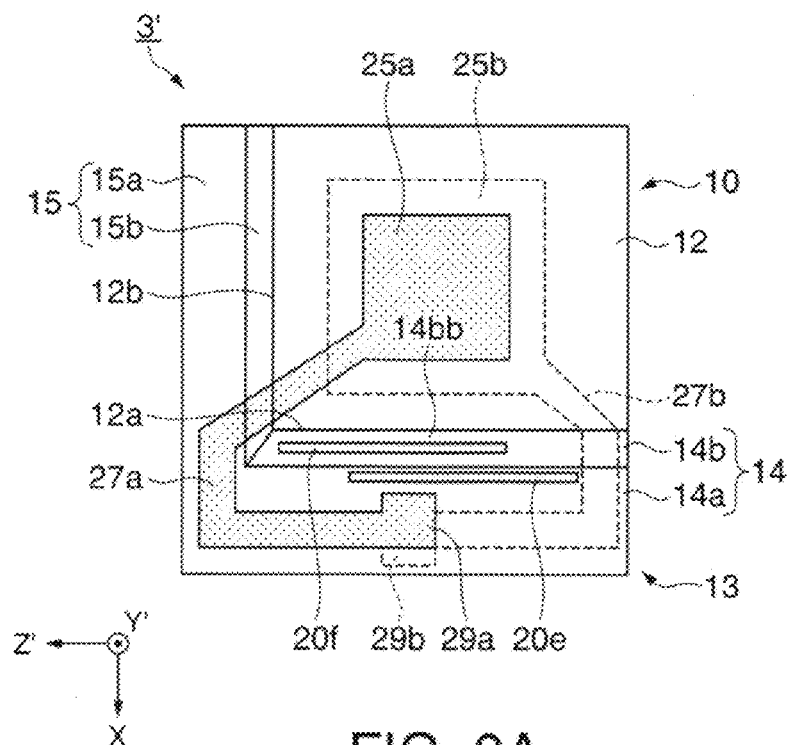
FIG. 8A is a plan view showing a configuration of a modification example of the piezoelectric vibrating element.

FIG. 8A is a plan view showing a configuration of a modification example of the piezoelectric vibrating element 3 shown in FIGS. 7A to 7C. In a piezoelectric vibrating element 3', the first slit 20e is provided within a plane of the first thick section main body 14a and the second slit 20f is provided within a plane of the first inclined section 14b. However, there is a different from the piezoelectric vibrating element 3 in that the first slit 20e and the second slit 20f are not disposed in parallel to each other in the X-axis direction as shown in the plan view of FIG. 7A, but disposed so as to be displaced from each other by a step-difference thereby being separated from each other in the Z'-axis direction. By providing two slits of the first slit 20e and the second slit 20f, an effect of preventing stress caused by a conductive adhesive from expanding to the vibrating section 12 can be improved.

Figure 8B:
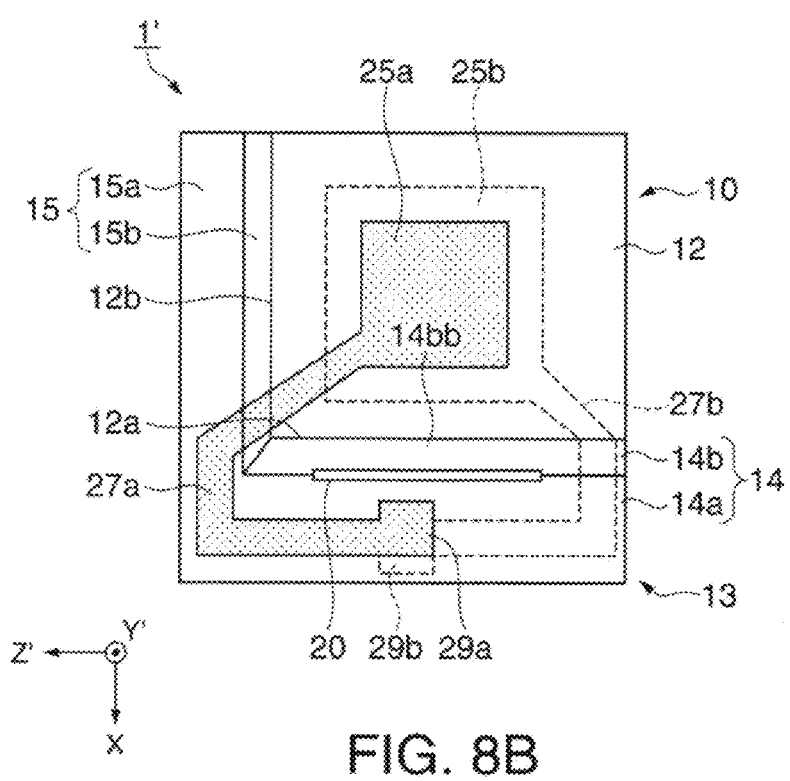
FIG. 8B is a plan view showing a configuration of a modification example of the piezoelectric vibrating elements.

FIG. 8B is a plan view showing a configuration of a modification example of the piezoelectric vibrating elements 1 and 2 according to the first and the second embodiments shown in FIGS. 1A to 1F and FIGS. 6A to 6C. In a piezoelectric vibrating element 1', the slit 20 is formed crossing the areas of the first thick section main body 14a and the first inclined section 14b. By providing the slit 20 in this way, an effect of satisfying the configurations of the piezoelectric vibrating elements 1 and 2 at the same time can be expected, and the effect of preventing stress caused by a conductive adhesive from expanding to the vibrating section 12 can be improved.

Figure 9:
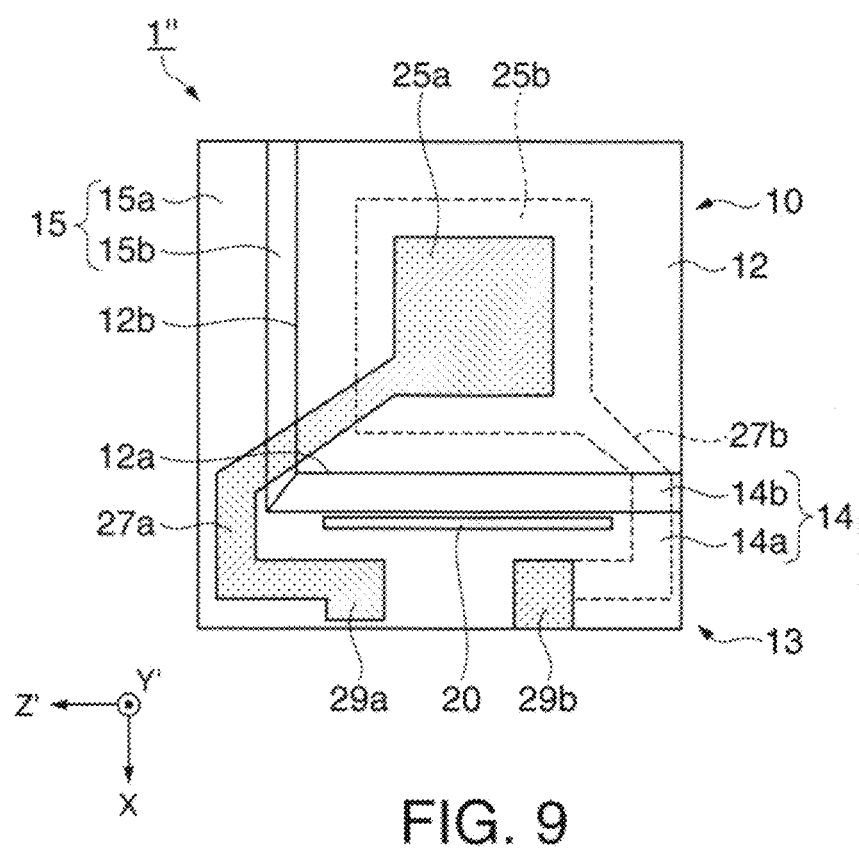
FIG. 9 is a plan view showing a configuration of a modification example of the piezoelectric vibrating element.

FIG. 9 is a plan view showing a configuration of a modification example of the piezoelectric vibrating element 1 of the embodiment shown in FIGS. 1A to 1F. In the piezoelectric vibrating element 1", the lead electrode 27a is formed so as to extend from a circumferential edge of the excitation electrode 25a on the front surface, pass through the front surface of the second thick section 15, and be continuously connected to the pad electrode 29a provided on the front surface on the left side of the center of the first thick section main body 14a. In addition, the lead electrode 27b is formed so as to extend from a circumferential edge of the excitation electrode 25b on the rear surface, pass through an edge of the rear surface and the circumferential edge of the piezoelectric substrate 10 where the rear surface comes into continuous contact with the front surface, and be arranged continuous to the pad electrode 29b provided on the front surface on the right side of the center of the first thick section main body 14a.

The difference from the piezoelectric vibrating element 1 of the embodiment shown in FIGS. 1A to 1F is the positions where the pad electrodes 29a and 29b are disposed. The pad electrodes 29a and 29b of a piezoelectric vibrating element 1" are provided being separated from each other on the front surface of the first thick section main body 14a. The pad electrode 29b includes a conductor thin film crossing a circumferential edge of the piezoelectric substrate 10 so as to be electrically connected to the lead electrode 27b formed on the rear surface. The pad electrodes 29a and 29b are configured so as to achieve easy electric conduction when a conductive adhesive is applied onto the pad electrodes 29a and 29b on the front surface side and the substrate is reversed so as to be mounted on an element-mounting pad of a package.

In other words, the configuration of the modification example of FIG. 9 intends to achieve electric conduction, support and fixation by applying a conductive adhesive to two spots (two points) of the first thick section 14 on one surface (front surface) of the piezoelectric vibrating element 1". The configuration is suitable for lowering the height, but there is concern that stress caused by the conductive adhesive slightly increases. Thus, by employing a piezoelectric vibrating element provided with two slits as shown in the piezoelectric vibrating elements 3 and 3' according to the third embodiment, it is expected to suppress the influence of stress arising during hardening of the conductive adhesive on a vibration area.

Alternatively, when the hardness of the conductive adhesive is relatively high, there is also a technique of reducing strain (stress) relating to mounting that occurs between the centers of the two points by narrowing the interval between the centers of the "two spots (two points)" to which the conductive adhesive is applied. On the other hand, when the hardness of the conductive adhesive is relatively low, there is also a technique of reducing strain (stress) relating to mounting that occurs between the center of the two points by using a silicon-based adhesive so as to cause the conductive adhesive to have a buffering property.

Figure 10:
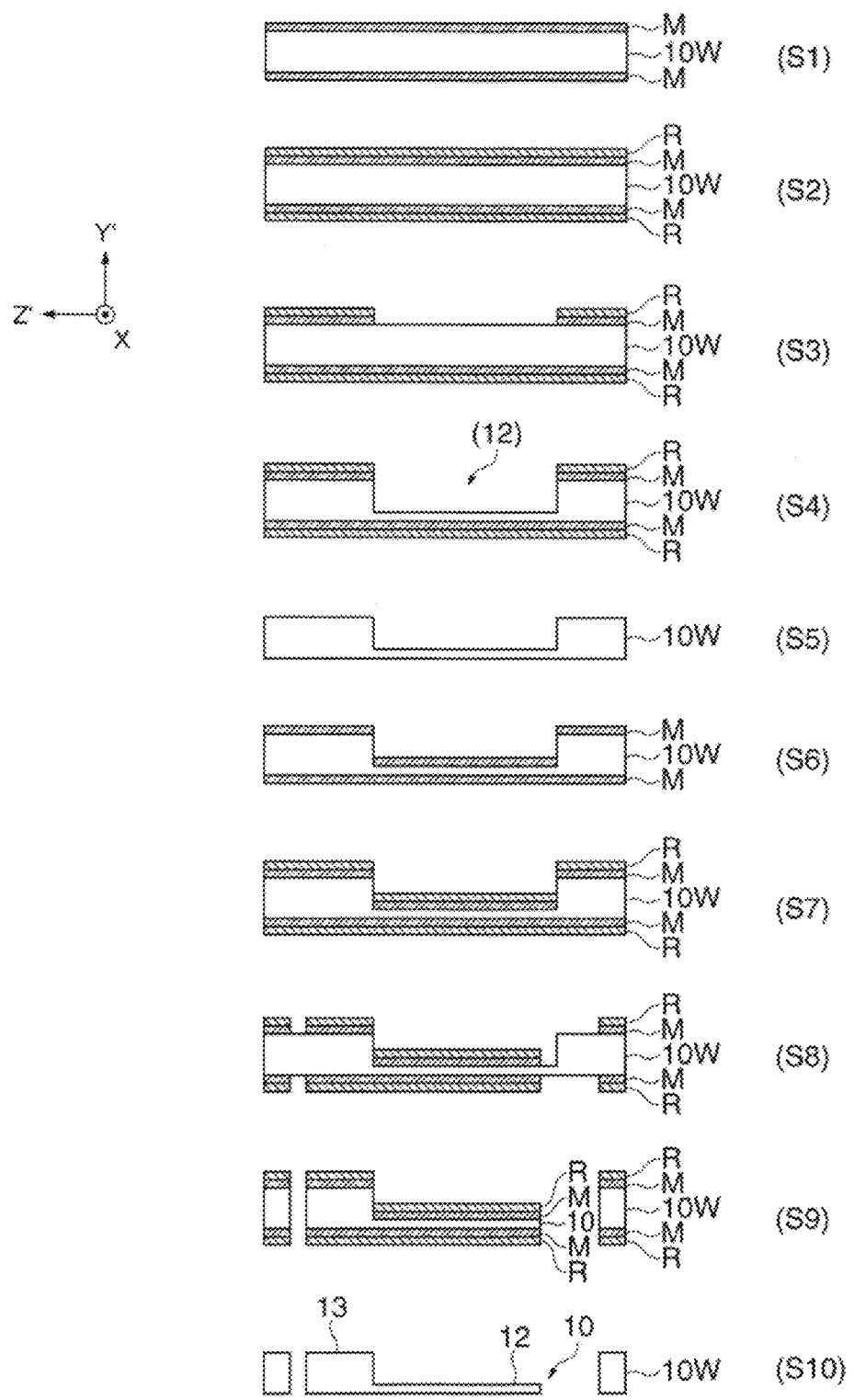
FIG. 10 is a manufacturing process diagram of a piezoelectric substrate.

FIG. 10 is a manufacturing process diagram relating to the vibrating section 12 of the piezoelectric substrate 10, an external shape thereof, and formation of the slit 20. Herein, a quartz crystal wafer is exemplified as a piezoelectric wafer and the drawing only shows a cross-section of the plane Y'-Z'.

In Step S1, a quartz crystal wafer 10W having a predetermined thickness of, for example, 80 μm and both surfaces that have undergone polishing is sufficiently cleaned, dried, and then, respective metal films (corrosion-proof film) M are formed in such a manner of having a chrome (Cr) film to be formed as the base and a gold (Au) film to be laminated thereon by performing sputtering, or the like for the front and rear surfaces of the wafer.

In Step S2, photoresist films (referred to as resist films) R are applied onto both surfaces of the metal films M formed as the front and rear surfaces.

In Step S3, a portion of the resist film R corresponding to the vibrating section 12 (recess) on the front surface is exposed to light by using a light exposure apparatus and a mask pattern. After the exposed resist film R is developed and then peeled, the metal film M at the position corresponding to the vibrating section 12 on the front surface is exposed. When the metal film M exposed from the resist film R is melted using a solution such as aqua regia and then removed, a quartz crystal plane at the position corresponding to the vibrating section 12 on the front surface is exposed.

In Step S4, the exposed quartz crystal plane is etched from the front surface side using a mixed solution of hydrofluoric acid (fluorinated acid) and ammonium fluoride until the portion has a desired thickness.

In Step S5, the resist films R on both surfaces are peeled using a predetermined solution and the further exposed metal films M on both surfaces are removed using aqua regia, or the like. In the quartz crystal wafer 10W in the stage, the recess formed at the position corresponding to the vibrating section 12 on the front surface (one surface) is in a state of being regularly arranged in a grid shape.

In Step S6, metal films M (Cr+Au) are formed on both surfaces of the quartz crystal wafer 10W obtained in Step S5.

In Step S7, respective resist films R are coated on both surfaces of the metal films M (Cr+Au) formed in Step S6.

In Step S8, by using a light exposure apparatus and a predetermined mask, respective resist films R at the position corresponding to the external shape of the piezoelectric substrate 10 and the slit 20 (not shown in the drawing) are exposed to light from both front and rear surfaces and developed, and then respective resist films R are peeled. Furthermore, the exposed metal films M are removed after being melt with a solution such as aqua regia, or the like.

In Step S9, the exposed quartz crystal planes are etched using a mixed solution of hydrofluoric acid (fluorinated acid) and ammonium fluoride so as to form the external shape of the piezoelectric substrate 10 and the slit 20. Furthermore, when the slit 20 is to be formed having respective bottom portions (refer to FIG. 1D) from both front and rear surface sides of the quartz crystal wafer 10W, the slit can be formed by using a change in an etching rate, or the like, occurring when the widths of the resist films R at the position corresponding to the slit 20 are reduced.

In Step S10, the remaining resist films R are peeled and the exposed metal films are melted and then removed. In this stage, in the quartz crystal wafer 10W, the piezoelectric substrates 10 each including the vibrating section 12 and the thick section 13 come into continuous contact with one another by a supporting narrow piece to be in a state of being regularly arranged in a grid shape.

Furthermore, the external shape of the cross-section orthogonal to the X axis has been shown, but the external shape of the cross-section orthogonal to the Z' axis will also be formed as shown in FIGS. 1A to 1F by performing etching for both surfaces.

After Step S10 is completed, the thickness of the vibrating section 12 of the piezoelectric substrate 10 regularly arranged in a grid shape on the quartz crystal wafer 10W is measured using, for example, an optical technique. When the measured thickness of the vibrating section 12 is thicker than a predetermined thickness, fine adjustment is performed for the thickness so as to be included in the range of the predetermined thickness.

Figure 11:
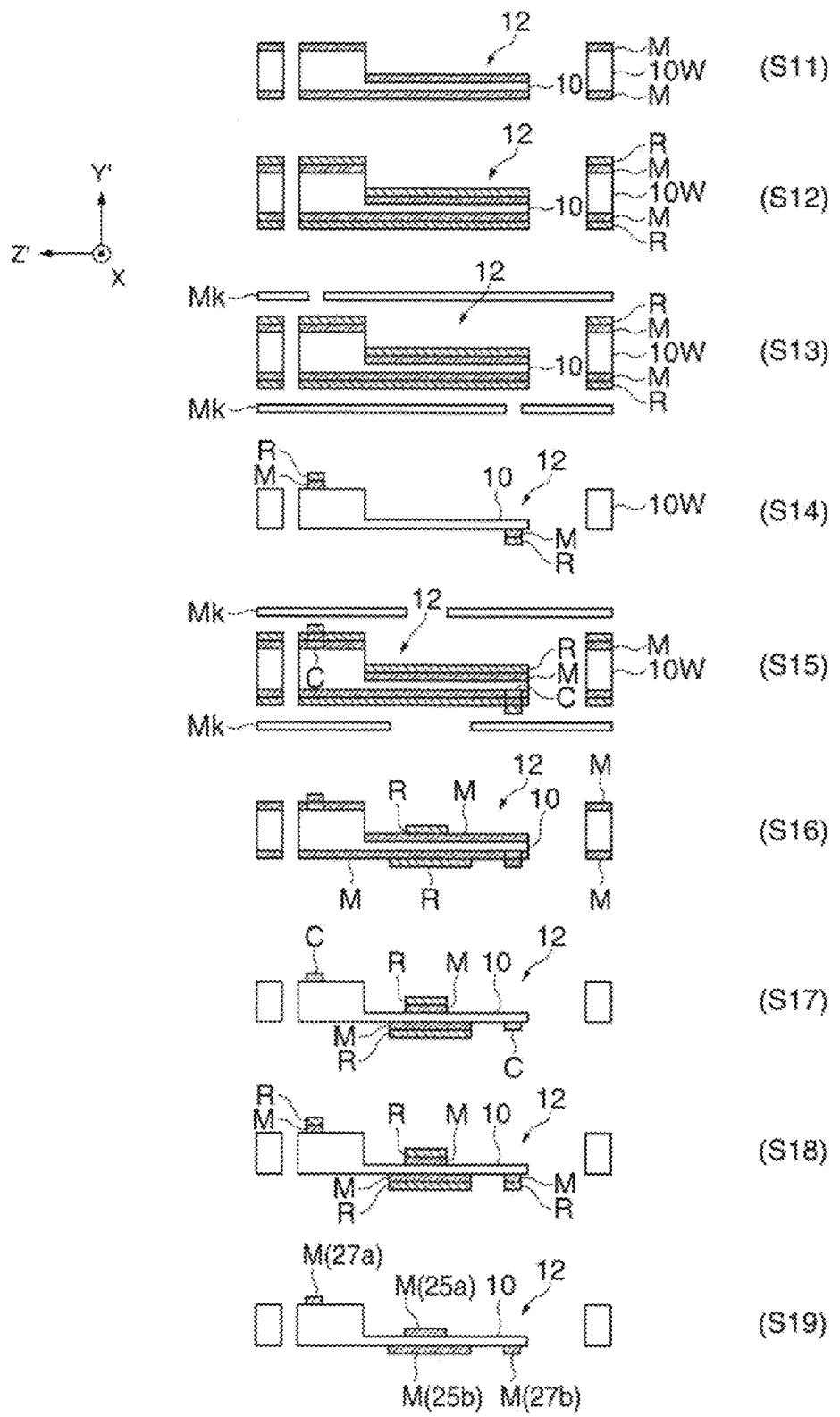
FIG. 11 is a manufacturing process diagram of an excitation electrode and a lead electrode of a piezoelectric vibrating element.

Next, the procedure of manufacturing a piezoelectric vibrating element in which the excitation electrodes 25a and 25b and the lead electrodes 27a and 27b are formed in the piezoelectric substrate 10 after the thickness of the vibrating section 12 of the piezoelectric substrate 10 formed on the quartz crystal wafer 10W is adjusted so as to be included in the range of the predetermined thickness will be described using the manufacturing process diagram of the excitation electrodes and the lead electrodes of the piezoelectric vibrating element shown in FIG. 11.

In Step S11, metal films M are formed over the entire front and rear surfaces of the quartz crystal wafer 10W by forming a chrome (Cr) thin film by performing sputtering, or the like and laminating a gold (Au) thin film thereon.

Next in Step S12, resist are coated on the metal films M respectively so as so form resist films R.

In Step S13, using a mask pattern Mk for the lead electrodes 27a and 27b and the pad electrodes 29a and 29b, the resist films R at the positions corresponding to the lead electrodes 27a and 27b and the pad electrodes 29a and 29b on the front and rear surfaces are exposed to light.

Next in Step S14, the resist films R are developed and then unnecessary resist films R are peeled. Through the peeling, the exposed metal films M are melted by using a solution such as aqua regia, or the like so as to be removed. The resist films R at the positions corresponding to the lead electrodes 27a and 27b and the pad electrodes 29a and 29b are left as they are.

Next in Step S15, metal films M are formed over the entire front and rear surfaces of the quartz crystal wafer 10W by forming a nickel (Ni) thin film by performing sputtering, or the like and laminating a gold (Au) thin film thereon. Further, resist films R are coated on the metal films M. In the drawing of Step S15, the metal film and the resist film (M+R) for the lead electrodes and the pad electrodes are expressed by a reference symbol C in order to avoid complexity. Then, the resist films R at the position corresponding to the excitation electrodes 25a and 25b are exposed to light using the mask pattern Mk for the excitation electrodes 25a and 25b.

In Step S16, after the resist films R exposed to light are developed, unnecessary resist films R are peeled using a solution.

Next in Step S17, the metal films M exposed after the resist films R are peeled are melted by a solution such as aqua regia and then removed. In Step S18, the reference symbol C (the metal film M and the resist film R for the lead electrodes and the pad electrodes) is restored to the metal film M and the resist film R.

In Step S19, after the unnecessary resist films R remaining on the metal films M are peeled, the excitation electrodes 25a and 25b of the metal film M (Ni+Au) and the lead electrodes 27a and 27b and the pad electrodes 29a and 29b not shown in the drawing of the metal film M (Cr+Au) are formed on the piezoelectric substrate 10.

After that, by breaking off the supporting narrow piece coming into continuous contact with the quartz crystal wafer 10W, a split piezoelectric vibrating element is obtained.

If wet-etching is performed for quartz crystal, however, the etching progresses along the Z axis, but etching anisotropy unique for quartz crystal that an etching rate changes according to the direction of each axis of the quartz crystal is exhibited. Thus, the fact that a difference is shown on etched planes that appear due to the anisotropy of the etching according to a direction of each axis of quartz crystal has been discussed hitherto in many academic papers and preceding patent literatures that have set etch anisotropy as their research theme. However, despite such a background, there is no material that clearly establishes a system of the etch anisotropy of quartz crystal, so at present, there are various opinions according to the literature with regard to the presence of a phase difference in appearing crystal planes such as whether the difference results from differences in general conditions (the type of an etching solution, an etching rate, etching temperature, and the like) due to an extremely strong aspect of a nano-processing technique.

Therefore, the inventors of the present application repeated etching simulations, trial manufacturing, and surface analysis and observation at a nano level for manufacturing a piezoelectric substrate using photolithography and wet-etching and then clarified that a piezoelectric vibrating element has the following aspects, and therefore, details thereof will be described below.

FIGS. 12A to 13E are diagrams showing schematic shapes of a recess 11 on the AT cut quartz crystal wafer 10W formed by photolithography and wet-etching.

Figure 12A:
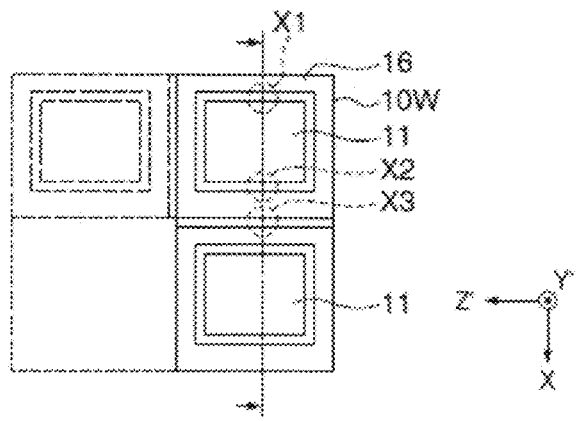
FIG. 12A is a plan view of respective recesses formed on a quartz crystal wafer.
Figure 12B:
FIGS. 12B to 12E are cross-sectional views of each of the recesses in the X-axis direction.

FIG. 12A is a plan view of the quartz crystal wafer 10W corresponding to Step S5 of FIG. 10. In this stage, the recess 11 is regularly formed on one surface of the quartz crystal wafer 10W in a grid shape. FIG. 12B is a cross-section in the X-axis direction in which each wall surface of the recess 11 shows an inclined surface, not a vertical surface. That is, a wall surface X1 in the −X-axis direction forms an inclined surface and a wall surface X2 in the +X-axis direction forms another inclined surface. If a groove orthogonal to the X axis is formed, a wall surface X3 of the groove in the ±X-axis direction is formed in a wedge shape.

Figure 12C:
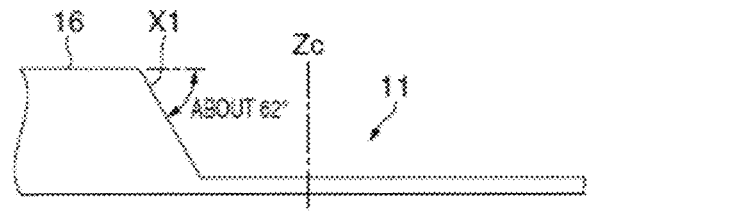
Figure 12D:
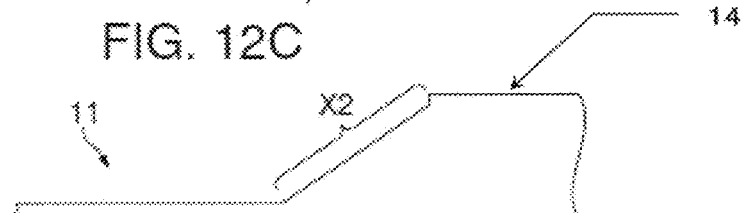
Figure 12E:
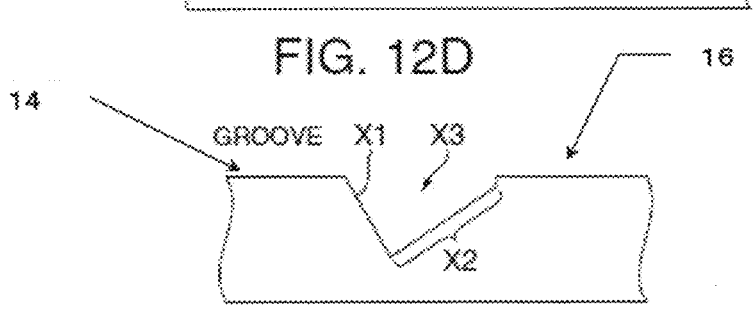

FIGS. 12C to 12E are enlarged views of the wall surfaces X1 and X2 of the recess 11 and the wall surface X3 of the groove. The wall surface X1 in the −X-axis direction is etched with inclination of about 62° with respect to the X-Z'plane of the quartz crystal wafer 10W as shown in FIG. 12C. The wall surface X2 in the +X-axis direction is orthogonal) (90° to the X-Z' plane of the quartz crystal wafer 10W and etching progresses, but after that, the etching further progresses to gradual inclination as shown in FIG. 12D. The bottom face of the formed recess 11 is etched in parallel to the original plane (X-Z' plane) of the quartz crystal wafer 10W. As a result, the vibrating section 12 turns into a plate shape of which the front and rear surfaces are parallel to each other.

FIG. 12E is a cross-sectional view of the groove formed on the quartz crystal wafer 10W. The cross-section of the groove formed orthogonal to the X axis forms a wedge shape. Since the wall surface X3 of the groove is formed with the wall surface X1 in the −X-axis direction and the wall surface X2 in the +X-axis direction, the wedge shape is shown.

When an electrode is provided on the surface where the recess 11 is formed, it is necessary to be cautious about the wall surface orthogonal to the wall surface X2 formed in the +X-axis direction. It is desirable to avoid the wall surface because cracks tend to be generated in an electrode film.

FIGS. 13A to 13E are diagrams showing wall surfaces of the recess 11 formed on the quartz crystal wafer 10W, particularly wall surfaces of the cross-section thereof in the Z'-axis direction.

Figure 13A:
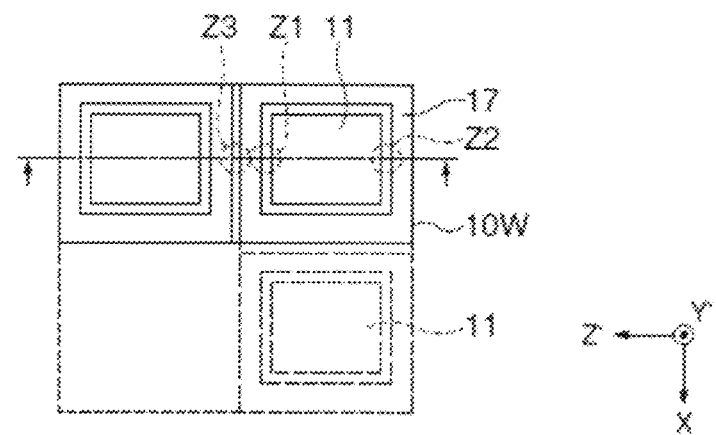
FIG. 13A is a plan view of respective recess formed on a quartz crystal wafer.

FIG. 13A is a plan view of the quartz crystal wafer 10W. FIGS. 13B to 13E are cross-sectional views of the Z'-axis direction of the quartz crystal wafer 10W taken from the +X-axis direction.

Figure 13B:
FIGS. 13B to 13E are cross-sectional views of each of the recesses in the Z'-axis direction.

As shown in FIG. 13B, a wall surface Z1 in the +Z'-axis direction forms an inclined surface, and a wall surface Z2 in the −Z'-axis direction forms another inclined surface. If a groove orthogonal to the Z' axis is formed, a wall surface Z3 of a cross-section of the groove shows a wedge shape.

Figure 13C:
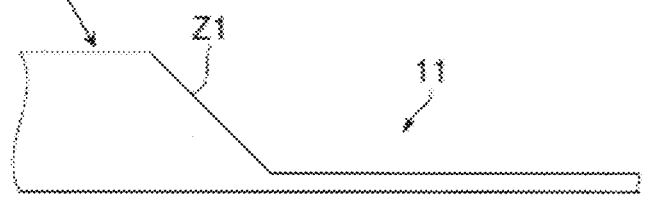
Figure 13D:
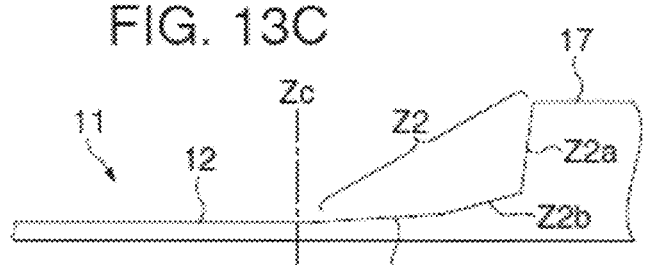
Figure 13E:
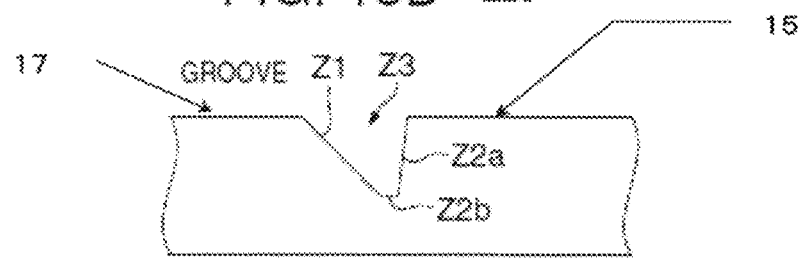

FIGS. 13C to 13E are enlarged view of the wall surfaces Z1 and Z2 of the recess 11 and the wall surface Z3 of the groove. As shown in FIG. 13C, the wall surface Z1 in the +Z'-axis direction is etched with relatively gradual inclination to the plane of the quartz crystal wafer 10W.

As shown in FIG. 13D, the wall surface Z2 in the −Z'-axis direction is etched with steep inclined surface Z2a to the plane of the quartz crystal wafer 10W, but successively, etching progresses with a gradually inclined surface Z2b and then a more gradually inclined surface Z2c is formed.

FIG. 13E is a cross-sectional view of the groove formed orthogonal to the Z'-axis direction showing the wall surface Z3 of a wedge-like cross-section. Since the wall surface Z3 of the groove is formed with the wall surface Z1 in the +Z'-axis direction, a wall surface Z2a in the −Z'-axis direction, and an inclined surface Z2b, substantially a wedge-like cross-section is shown.

One of the characteristics of the embodiment is that miniaturization of the piezoelectric substrate 10 has been attempted by removing the gradually inclined surface Z2c closer to the −Z' axis than to the dashed line Zc and the thick section 17 formed continuous thereto as shown in FIG. 13D and the wall surface X1 closer to the −X axis than to the dashed line Zc and the thick section 16 formed continuous thereto as shown in FIG. 12C through etching. As a result, the vibrating section 12 is a part of the piezoelectric substrate 10 in which two adjacent sides thereof are held by the L-shaped thick section 13.

Furthermore, the manufacturing method has been established on the premise that the gradually inclined surface Z2c and the thick section 17 and the wall surface X1 and the thick section 16 are removed together. Thus, it has been realized that a larger area of a flat ultra-thin portion that will serve as the vibrating section 12 is secured than in the configuration exemplified as a preceding technique in which thick sections present in both ends of a vibration area are provided along the X axis as in the related art.

As a result, it was possible to design the element sufficiently considering that, in a thickness shear vibration mode in which excitation occurs in the vibration area, vibration displacement distribution caused by anisotropy of an elastic constant shows an elliptical shape having a long diameter in the X-axis direction, and the ratio of the long axis to the short axis is desirably 1.26:1, and thus, it was possible to design the element within the range of 1.14 to 1.39:1 after considering unevenness in dimensions occurring in manufacturing, or the like.

Figure 14A:
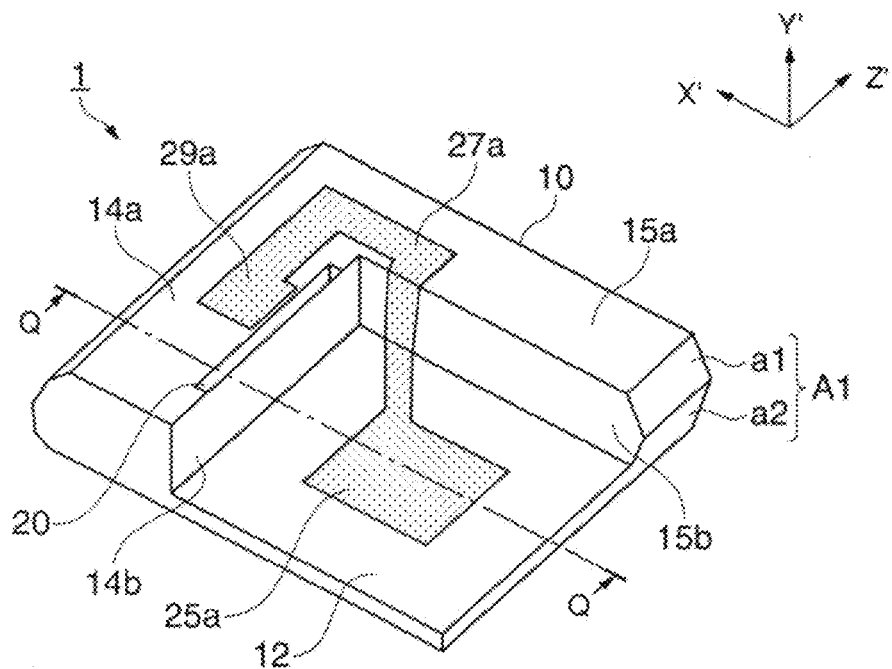
FIG. 14A is a perspective view of the piezoelectric vibrating element shown in FIGS. 1A to 1F.
Figure 14B:
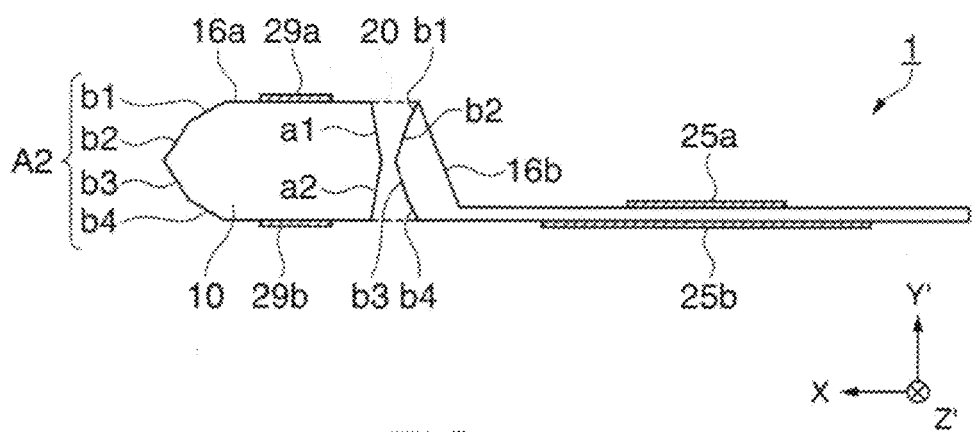
FIG. 14B is a vertically cross-sectional view of the line Q-Q (showing only the cut surface).

FIGS. 14A and 14B are diagrams of the piezoelectric vibrating element 1 shown in FIGS. 1A to 1F in more detail, FIG. 14A is a perspective view thereof, and FIG. 14B shows a cut face of cross-section Q-Q in FIG. 1A. As shown in FIGS. 14A and 14B, in the external shape of the piezoelectric vibrating element 1, an inclined surface appears on an edge face crossing the X axis. In other words, an inclined surface A1 of FIG. 14A appears on an edge face on the −X-axis side and an inclined surface A2 of FIG. 14B appears on an edge face on the +X-axis side. The cross-sectional shapes of the inclined surfaces A1 and A2 parallel to the X-Y' plane are different from each other.

In addition, for both of the inclined surfaces A1 and A2, a vertical wall surface as the wall surface X2 formed in the +X-axis direction as shown in FIGS. 12B and 12D does not appear in the vicinity where the edge faces and the front surface of the piezoelectric substrate 10. The reason is that, in comparison to a necessary etching time for forming the recess 11, the formation time of the inclined surfaces A1 and A2 has a sufficient etching time since etching starts from the front and rear surfaces of the piezoelectric substrate (quartz crystal substrate) 10 and continues until the substrate is penetrated, and due to such over-etching, a vertical wall surface does not appear.

It has been clarified that inclined faces a1 and a2 constituting the inclined surface A1 are substantially symmetric with respect to the X axis, and with regard to inclined faces b1, b2, b3, and b4 constituting the inclined surface A2, the inclined faces b1 and b4 and the inclined faces b2 and b3 are substantially symmetric with respect to the X axis. Furthermore, an inclination angle α of the inclined faces a1 and a2 with respect to the X axis and an inclination angle β of the inclined faces b1 and b4 with respect to the X axis are in the relationship of β<α.

As shown in the first to third embodiments, as the piezoelectric vibrating elements 1, 2 and 3 of a high frequency using the fundamental mode is miniaturized and mass-produced, and the slit 20 is provided between the thick section 13 and the vibrating section 12, expansion of stress caused by adhesion and fixation can be suppressed, and therefore, there is an effect of obtaining the piezoelectric vibrating elements 1, 2 and 3 that are excellent in the frequency-temperature characteristic, a CI-temperature characteristic, and the frequency aging characteristic.

In addition, as shown in FIGS. 3A and 3B, since the excitation electrodes 25a and 25b, the lead electrodes 27a and 27b, and the pad electrodes 29a and 29b respectively uses metal materials with different compositions and are configured to have optimum thicknesses, there is an effect of obtaining a piezoelectric vibrating element having a small CI value of the main vibration, and a high ratio of a CI value of proximate spurious vibrations to the CI value of the main vibration, that is, a high CI value ratio.

In addition, as shown in FIGS. 1A to 1F and FIGS. 3A and 3B, since the excitation electrodes 25a and 25b are formed of a laminated film of nickel and gold and the lead electrodes 27a and 27b and the pad electrodes 29a and 29b are formed of a laminated film of chrome and gold, there is an effect of obtaining a piezoelectric vibrating element that sufficiently tolerates bonding while having a small CI value of the main vibration, and a high ratio of a CI value of proximate spurious vibrations to the CI value of the main vibration, that is a high CI value ratio.

Since the piezoelectric substrate 10 is formed as shown in the cutting angle diagram of FIG. 2, there is an effect that the piezoelectric vibrating element with required specifications can be configured in a more proper cutting angle, and a high-frequency piezoelectric vibrating element having the frequency-temperature characteristic conforming with the specifications, a low CI value, and a high CI value ratio is obtained.

In addition, since performance and experience of photolithography and etching can be utilized when an AT cut quartz crystal substrate is used for the piezoelectric substrate 10, there is an effect not only that mass production of piezoelectric substrates is possible with high precision, but also that mass production of piezoelectric vibrating elements having a low CI value and a high CI value ratio is possible.

Figure 15A:
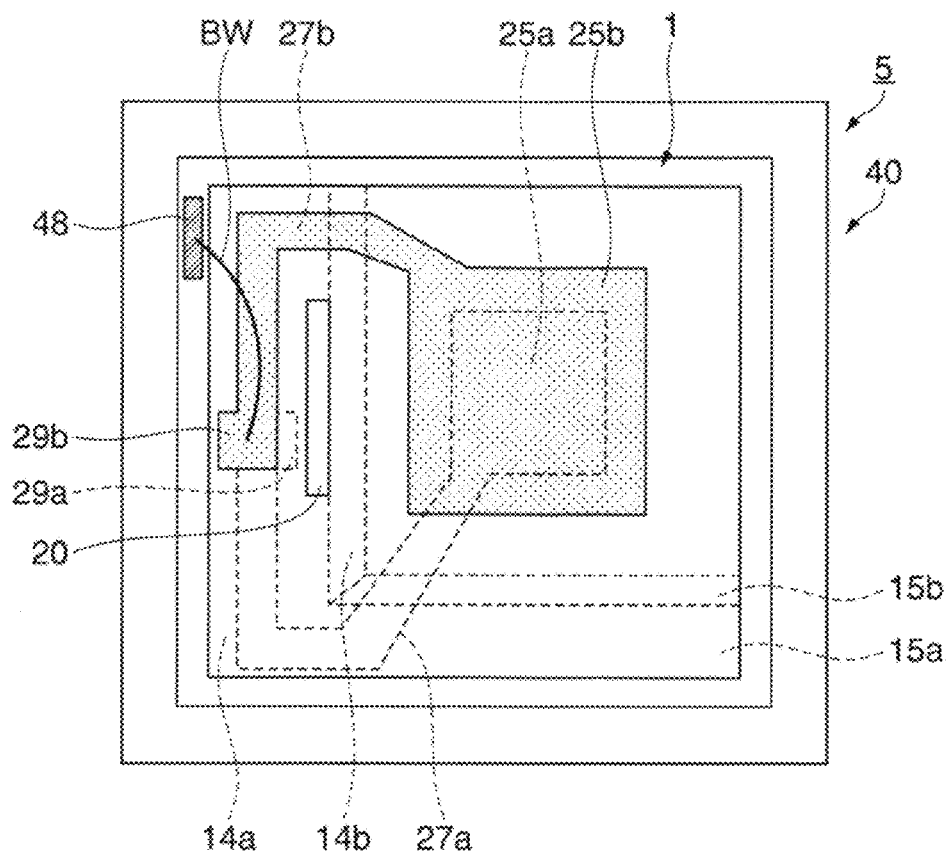
FIG. 15A is a plan view of a piezoelectric resonator.
Figure 15B:
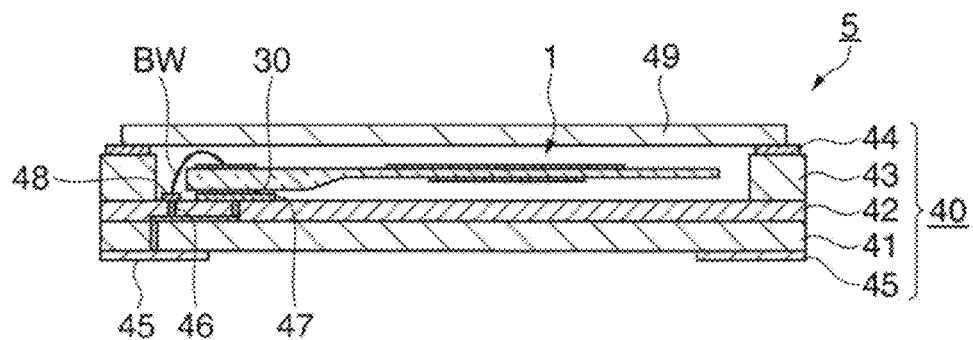
FIG. 15B is a vertically cross-sectional view thereof.

FIGS. 15A and 15B are diagrams showing a configuration of a piezoelectric resonator 5 according to an embodiment of the invention, FIG. 15A is a plan view in which a cover member is omitted, and FIG. 15B is a vertical cross-sectional view.

As shown in FIGS. 15A and 15B, the piezoelectric resonator 5 includes, for example, the piezoelectric vibrating element 1 and a package accommodating the piezoelectric vibrating element 1. The package is constituted by a package main body 40 formed in a rectangular box shape, and a cover member 49 formed of metal, ceramic, glass, or the like. Furthermore, in description below, the direction in which the cover member 49 is placed over the package main body 40 in FIG. 15B will be regarded as the upper direction (upper surface side) for the sake of convenience.

The package main body 40 is formed by laminating a first substrate 41, a second substrate 42, and a third substrate 43 in such a way that a ceramic green sheet of aluminum oxide as an insulating material is molded in a box shape and then sintered. A plurality of mounting terminals 45 are formed on the external bottom surface of the first substrate 41. The third substrate 43 is a circular body without the center portion, and a metal seal ring 44 of, for example, kovar, or the like is formed on the upper circumferential edge of the third substrate 43.

With the third substrate 43 and the second substrate 42, a recessed portion (cavity) for accommodating the piezoelectric vibrating element 1 is formed. At a predetermined position on the upper surface of the second substrate 42, an element-mounting pad 47 that is electrically connected to the mounting terminal 45 with a conductor 46 is provided. The position of the element-mounting pad 47 is determined so as to correspond to that of the pad electrode 29a formed in the first thick section main body 14a when the piezoelectric vibrating element 1 is placed.

When the piezoelectric vibrating element 1 is to be fixed, first, a conductive adhesive 30 is applied onto the pad electrode 29a of the piezoelectric vibrating element 1, the upper and lower sides of the piezoelectric vibrating element 1 are reversed (turned over) so as to be placed on the element-mounting pad 47 of the package main body 40, and then weight is exerted thereon. As a characteristic of the conductive adhesive 30, the magnitude of stress (∝ strain) caused by the conductive adhesive 30 becomes great in order of a silicon-based adhesive, an epoxy-based adhesive, and a polyimide-based adhesive. In addition, the amount of degassing becomes great in order of a polyimide-based adhesive, an epoxy-based adhesive, and a silicon-based adhesive. In consideration of a temporal change, a polyimide-based adhesive with a small amount of degassing was used as the conductive adhesive 30.

In order to harden the conductive adhesive 30 of the piezoelectric vibrating element 1 mounted on the package main body 40, the package is fed into a high-temperature furnace of a predetermined temperature for a predetermined time. After the conductive adhesive 30 is hardened, the pad electrode 29b shown on the front surface side after being reversed and an electrode terminal 48 of the package main body 40 are electrically connected by a bonding wire BW. As shown in FIG. 15B, since the portion at which the piezoelectric vibrating element 1 is supported by and fixed to the package main body 40 is one spot (one point), that is, only the portion to which the pad electrode 29a and the element-mounting pad 47 are fixed, the magnitude of stress resulting from support and fixation can be reduced.

After performing an annealing process, a frequency is adjusted by increasing or decreasing the mass of the excitation electrodes 25a and 25b. The cover member 49 is placed on the seal ring 44 formed on the upper surface of the package main body 40, and then the cover member 49 is sealed by performing seam welding in vacuum or in the atmosphere of nitrogen ($N_2$) gas, whereby the piezoelectric resonator 5 is completed. Alternatively, there is a method in which the cover member 49 is placed on low-melting-point glass coated over the upper surface of the package main body 40 and then melted so as to come into tight contact with the package. Also in this case, the piezoelectric resonator 5 is completed in such a way that the inside of the cavity of the package is made vacuum or filled with inert gas such as nitrogen ($N_2$) gas. Furthermore, vacuum described in the present specification refers to low-pressure atmosphere or a low-vacuum state.

In the respective piezoelectric vibrating elements 1, 2, and 3 shown in FIGS. 1A to 1F, FIGS. 6A to 6C, and FIGS. 7A to 7C, the pad electrodes 29a and 29b disposed so as to respectively face the front and rear surface of the piezoelectric substrate 10 are formed. As shown in FIGS. 15A and 15B, when the package main body 40 accommodates the piezoelectric vibrating element 1, the piezoelectric vibrating element 1 is turned over, and the pad electrode 29a and the element-mounting pad 47 of the package main body 40 are fixed and connected to each other with the conductive adhesive 30. The pad electrode 29b shown on the front surface side after being reversed and the electrode terminal 48 of the package main body 40 are connected by the bonding wire BW. In this manner, if a portion for supporting the piezoelectric vibrating element 1 is one point, stress caused by the conductive adhesive 30 becomes small. In addition, if the piezoelectric vibrating element 1 is turned over so as to arrange the bigger excitation electrode 25b in the upper surface when being accommodated in the package main body 40, frequency adjustment of the piezoelectric vibrating element 1 becomes easy.

In addition, the piezoelectric resonator 5 may be configured by using a piezoelectric vibrating element in which the interval of the pad electrodes 29a and 29b is set apart. Also in this case, a piezoelectric resonator can be configured in the same manner of the piezoelectric resonator 5 described in FIGS. 15A and 15B.

Furthermore, as shown in FIG. 9, the piezoelectric resonator 5 may be configured by using the piezoelectric vibrating element 1″ in which the interval of the pad electrodes 29a and 29b is set apart on the same plane. In this case, the piezoelectric vibrating element 1″ is configured so as to be supported and fixed in such a way that the conductive adhesive 30 is applied onto the respective pad electrodes 29a and 29b, reversed, placed on the element-mounting pad 47 formed in the package main body 40, and then weight is exerted thereon. The configuration is appropriate for reducing the height, but since the supported portions are two points, which are the pad electrodes 29a and 29b, there is concern that stress caused by the conductive adhesive 30 slightly increases.

In the embodiment of the piezoelectric resonator 5 above, an example in which a laminated plate is used over the package main body 40, however, a piezoelectric resonator may be configured by using a single-layered ceramic plate for the package main body 40 and a cap obtained by performing a drawing process for a cover.

Since the piezoelectric resonator shown in FIGS. 15A and 15B is configured using the piezoelectric vibrating elements 1, 2, and 3 shown in FIGS. 1A to 1F, FIGS. 6A to 6C, and FIGS. 7A to 7C, a high-frequency piezoelectric resonator is miniaturized, a portion supporting the piezoelectric vibrating elements 1, 2, and 3 is one point, and stress caused by the conductive adhesive 30 can be reduced by providing the slit 20 between the thick section 13 and the vibrating section 12, and therefore, there is an effect of obtaining a piezoelectric resonator excellent in frequency reproducibility, the frequency temperature characteristic, the CI-temperature characteristic, and the frequency aging characteristic.

In addition, as shown in the embodiment of FIGS. 3A and 3B, since the electrode material of the excitation electrodes 25a and 25b and the electrode material of the lead electrodes 27a and 27b and the pad electrodes 29a and 29b differ from each other, and the piezoelectric vibrating elements 1, 2, and 3 of which film thicknesses are configured to be optimum for respective functions are used, there is an effect of obtaining the piezoelectric vibrating elements 1, 2, and 3 having a small CI value of the main vibration, and a high ratio of a CI value of proximate spurious vibrations to the CI value of the main vibration, that is, a high CI value ratio.

Figure 16:
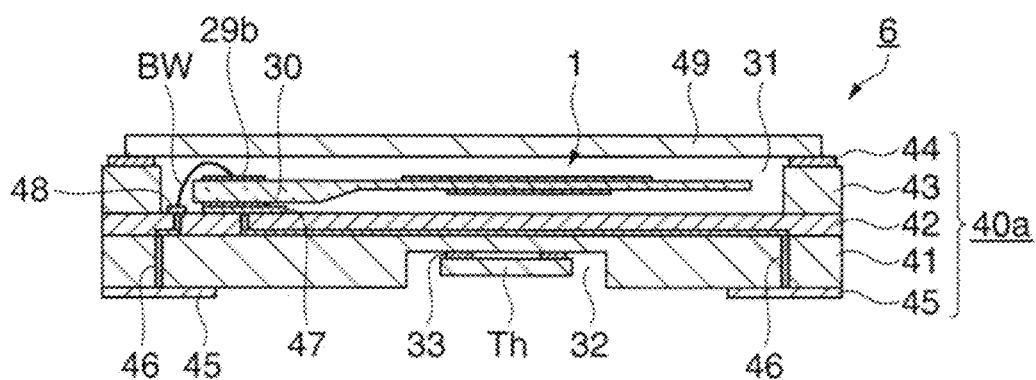
FIG. 16 is a vertically cross-sectional view of an electronic device (piezoelectric device).

FIG. 16 is a vertical cross-sectional view showing an embodiment of an electronic device according to the invention. The electronic device 6 generally includes the piezoelectric vibrating element 1 (which may be the piezoelectric vibrating elements 2 or 3), a thermistor Th that is a temperature-sensing element as a temperature sensor of one electronic component, and a package accommodating the piezoelectric vibrating element 1 and the thermistor Th. Also in description below, the direction in which the cover member 49 is placed over the package main body 40 will be regarded as the upper direction (upper surface side) and the opposite direction to the upper direction as the lower direction (lower surface side).

The package includes a package main body 40a and the cover member 49. The package main body 40a has a cavity 31 formed on the upper surface side for accommodating the piezoelectric vibrating element 1, and a recess 32 formed outside on the lower surface side for accommodating the thermistor Th. In an edge of the inner bottom surface of the cavity 31, the element-mounting pad 47 is provided, and the element-mounting pad 47 is electrically connected to the mounting terminal 45 with the conductor 46. The conductive adhesive 30 is applied onto the pad electrode 29a of the piezoelectric vibrating element 1, and then the element is reversed, and placed on the element-mounting pad 47. The pad electrode 29b shown on the front surface side after being reversed and the electrode terminal 48 are connected by the bonding wire BW.

The seal ring 44 composed of kovar, or the like is burned on the upper portion of the package main body 40a, the cover member 49 is placed over the seal ring 44 and welded using a resistance welder so as to air-tightly seal the cavity 31. The inside of the cavity 31 may be made vacuum, or filled with inert gas. A terminal of the thermistor Th is connected to the recess 32 on the rear surface using solder balls, or the like, whereby the electronic device 6 is completed.

In the above embodiment, an example has been described in which the recess 32 is formed outside on the lower surface side of the package main body 40a to mount an electronic component, however, the recess 32 may be formed on the inner bottom surface of the package main body 40a to mount the electronic component.

In addition an example has been described in which the package main body 40a accommodates the piezoelectric vibrating element 1 and the thermistor Th, however, it is desirable to configure an electronic device by accommodating at least one of a thermistor, a capacitor, a reactance element, and a semiconductor element as an electronic component that the package main body 40a accommodates.

If the electronic device 6 is configured in which the package main body 40a accommodates the piezoelectric vibrating element 1 and the thermistor Th as in the embodiment shown in FIG. 16, the thermistor Th of the temperature-sensing element is disposed at an excessively close position to the piezoelectric vibrating element 1, and therefore, there is an effect of swiftly sensing a temperature change of the piezoelectric vibrating element 1.

In addition, since a small-sized high-frequency electronic device can be configured by constituting the electronic device with the piezoelectric vibrating element according to the embodiment of the invention and the above-described electronic component, there is an effect of using the device in various applications.

Furthermore, if an electronic device (piezoelectric device) is configured using any one of a variable capacitance element, a thermistor, an inductor, and a capacitor as an electronic component, there is an effect of realizing a small-sized electronic device more suitable for required specifications at low cost.

Figure 17A:
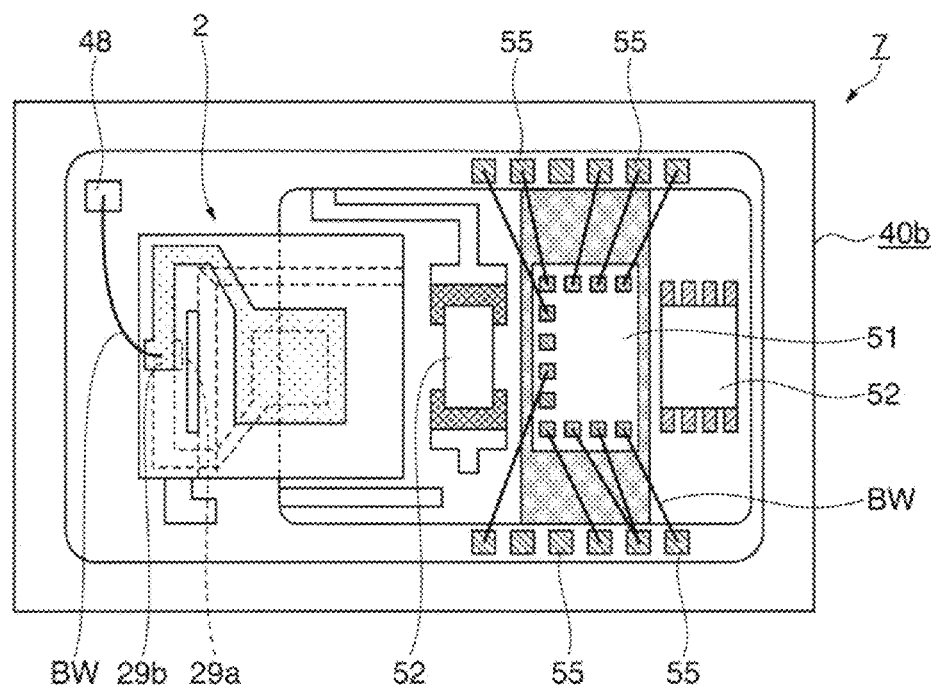
FIG. 17A is a plan view of an electronic device (piezoelectric device)
Figure 17B:
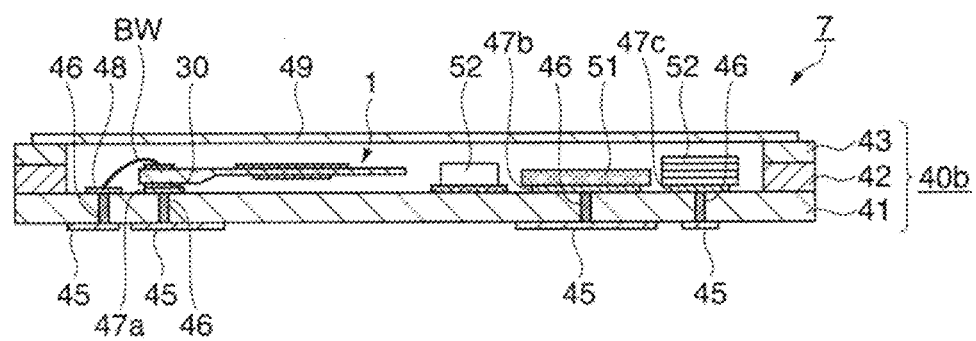
FIG. 17B is a vertically cross-sectional view thereof.

FIGS. 17A and 17B are diagrams showing a configuration of a piezoelectric oscillator 7 that is one kind of an electronic device according to an embodiment of the invention, FIG. 17A is a plan view in which a cover member is omitted, and FIG. 17B is a vertical cross-sectional view. The piezoelectric oscillator 7 includes a package main body 40b, the cover member 49, the piezoelectric vibrating element 1, an IC component 51 mounted with an oscillator circuit for exciting the piezoelectric vibrating element 1, and an electronic component 52 such as a variable capacitance element for changing capacitance by voltage, a thermistor for changing resistance by temperature, an inductor, or the like.

The (polyimide-based) conductive adhesive 30 is applied onto the pad electrode 29a of the piezoelectric vibrating element 1, the element is reversed so as to be placed on an element-mounting pad 47a of the package main body 40b, and the pad electrode 29a and the element-mounting pad 47a are electrically connected to each other. The pad electrode 29b shown on the front surface side after being reversed and the electrode terminal 48 of the package main body 40b are connected by the bonding wire BW.

The IC component 51 is fixed to a predetermined position of the package main body 40b, and terminals of the IC component 51 is connected to electrode terminals 55 of the package main body 40b by the bonding wire BW so as to achieve electric conduction. In addition, the electronic component 52 is placed at a predetermined position of the package main body 40b and connected using a metal bump.

The package main body 40b is made vacuum or filled with inert gas such as nitrogen gas, and sealed by the cover member 49, whereby the piezoelectric oscillator (electronic device) 7 is completed.

In the technique of connecting the pad electrode 29b and the electrode terminal 48 of the package main body 40b with the bonding wire BW, the portion supporting the piezoelectric vibrating element 1 is one point and stress caused by the conductive adhesive 30 becomes small. In addition, since the bigger excitation electrode 25b is disposed on the upper surface after the upper and lower sides of the piezoelectric vibrating element 1 is reversed during accommodation of the package main body 40b, frequency adjustment of the piezoelectric oscillator (electronic device) 7 becomes easy.

Figure 18:
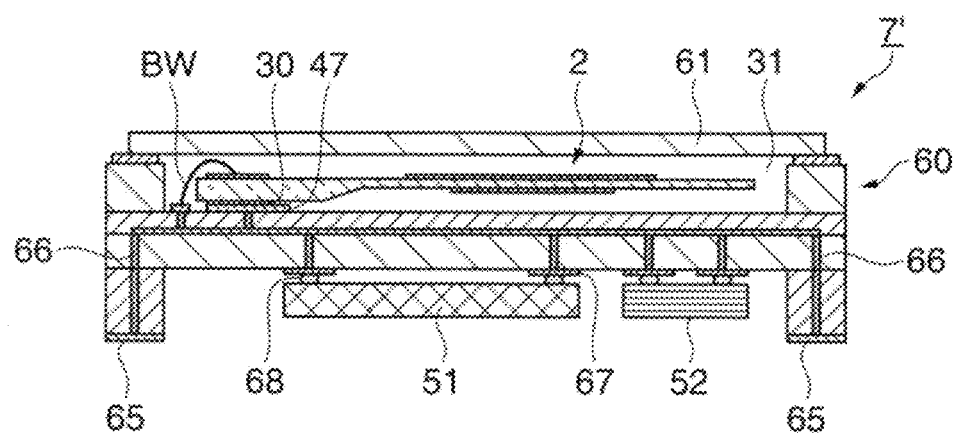
FIG. 18 is a vertically cross-sectional view of a modification example of an electronic device (piezoelectric device).

In the piezoelectric oscillator (electronic device) 7 shown in FIGS. 17A and 17B, the piezoelectric vibrating element 1, the IC component 51, and the electronic component 52 are disposed on the same package main body 40b, however, in the piezoelectric oscillator 7' that is a modification example of the piezoelectric oscillator 7 shown in FIG. 18, the cavity 31 formed on the upper side accommodates the piezoelectric vibrating element 1 using an H-shaped package main body 60, the inside of the cavity 31 is made vacuum or filled with nitrogen (N$_2$) gas, and sealed by a cover member 61. The IC component 51 on which an amplifier circuit, an oscillator circuit for exciting the piezoelectric vibrating element 1, or the like is mounted and the electronic component 52 such as a variable capacitance element or an inductor, a thermistor, a capacitor, or the like depending on necessity in the lower portion are connected to terminals 67 of the package main body 60 via a metal bump (Au bump) 68.

Since, in the piezoelectric oscillator 7' that is a modification example of the electronic device according to an embodiment of the invention, the piezoelectric vibrating element 1, the IC component 51, and the electronic component 52 are separated, and the piezoelectric vibrating element 1 is solely air-tightly sealed, the frequency aging characteristic of the piezoelectric oscillator 7' is excellent.

By configuring the electronic device (for example, a voltage-controlled type piezoelectric oscillator) as shown in FIGS. 17A to 18, there is an effect of obtaining a small-sized voltage-controlled piezoelectric oscillator of a high frequency (for example, the 490 MHz band) having the excellent frequency reproducibility, frequency-temperature characteristic, and frequency aging characteristic. In addition, since a piezoelectric device uses the piezoelectric vibrating element 1 of the fundamental mode, a capacitance ratio is low and a frequency variable width expands. Furthermore, there is an effect of obtaining a voltage-controlled piezoelectric oscillator with a satisfactory S/N ratio.

In addition, there is another effect that a piezoelectric oscillator, a temperature-compensated piezoelectric oscillator, or the like can be configured as a piezoelectric device, and a piezoelectric oscillator having the excellent frequency reproducibility, frequency aging characteristic, and frequency-temperature characteristic can be configured.

Electronic Apparatus

Next, an electronic apparatus to which the piezoelectric resonator 5 using the piezoelectric vibrating element 1 according to an embodiment of the invention will be described in detail based on FIGS. 19 to 23.

Figure 19:
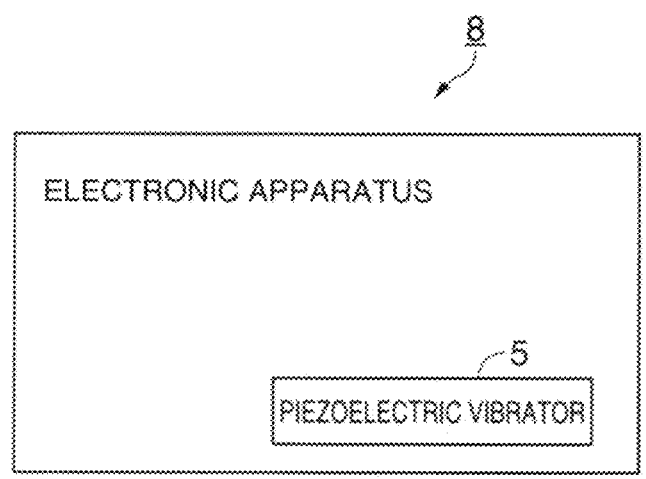
FIG. 19 is a pattern diagram of an electronic apparatus.

FIG. 19 is a schematic configuration diagram showing a configuration of an electronic apparatus according to the embodiment. The electronic apparatus 8 includes the above-described piezoelectric resonator 5. As the electronic apparatus 8 using the piezoelectric resonators, a transmission apparatus, or the like can be exemplified. The piezoelectric resonator 5 in the electronic apparatus 8 is used as a reference signal source, a voltage-controlled piezoelectric oscillator (VCXO), or the like and can provide a small-sized electronic apparatus with satisfactory features.

By using the piezoelectric resonator 5 of the present embodiment in the electronic apparatus 8 as shown in the pattern diagram of FIG. 19, there is an effect of configuring an electronic apparatus having excellent frequency stability at a high frequency and a reference frequency source with a satisfactory S/N ratio.

Figure 20:
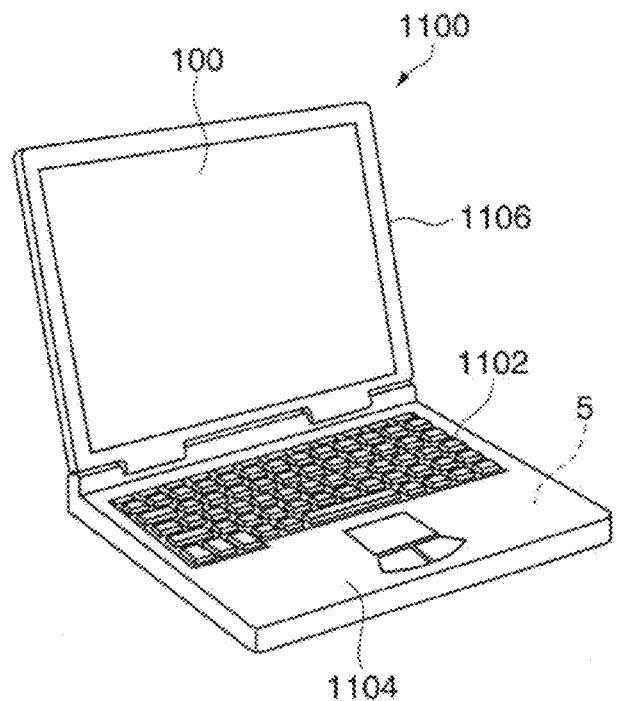
FIG. 20 is a perspective view showing a configuration of a portable type personal computer as an example of the electronic apparatus.

FIG. 20 is a perspective view showing a schematic configuration of a portable type (or note type) personal computer as an electronic apparatus including the piezoelectric resonator 5 according to an embodiment of the invention. In the diagram, the personal computer 1100 is constituted by a main body section 1104 including a keyboard 1102 and a display unit 1106 including a display section 100, and the display unit 1106 is supported rotatable with respect to the main body section 1104 via a hinge structure section. In such a personal computer 1100, the piezoelectric resonator 5 is built.

Figure 21:
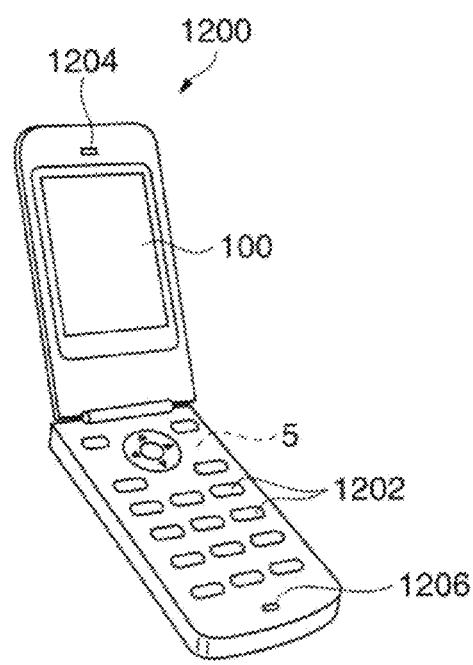
FIG. 21 is a perspective view showing a configuration of a mobile telephone as another example of the electronic apparatus.

FIG. 21 is a perspective view showing a schematic configuration of a mobile telephone (also including a PHS) as an electronic apparatus including the piezoelectric resonator 5 according to an embodiment of the invention. In the drawing, the mobile telephone 1200 include a plurality of operation buttons 1202, an earpiece 1204, and a mouthpiece 1206, and a display section 100 is disposed between the operation buttons 1202 and the earpiece 1204. In such a mobile telephone 1200, the piezoelectric resonator 5 is built.

Figure 22:
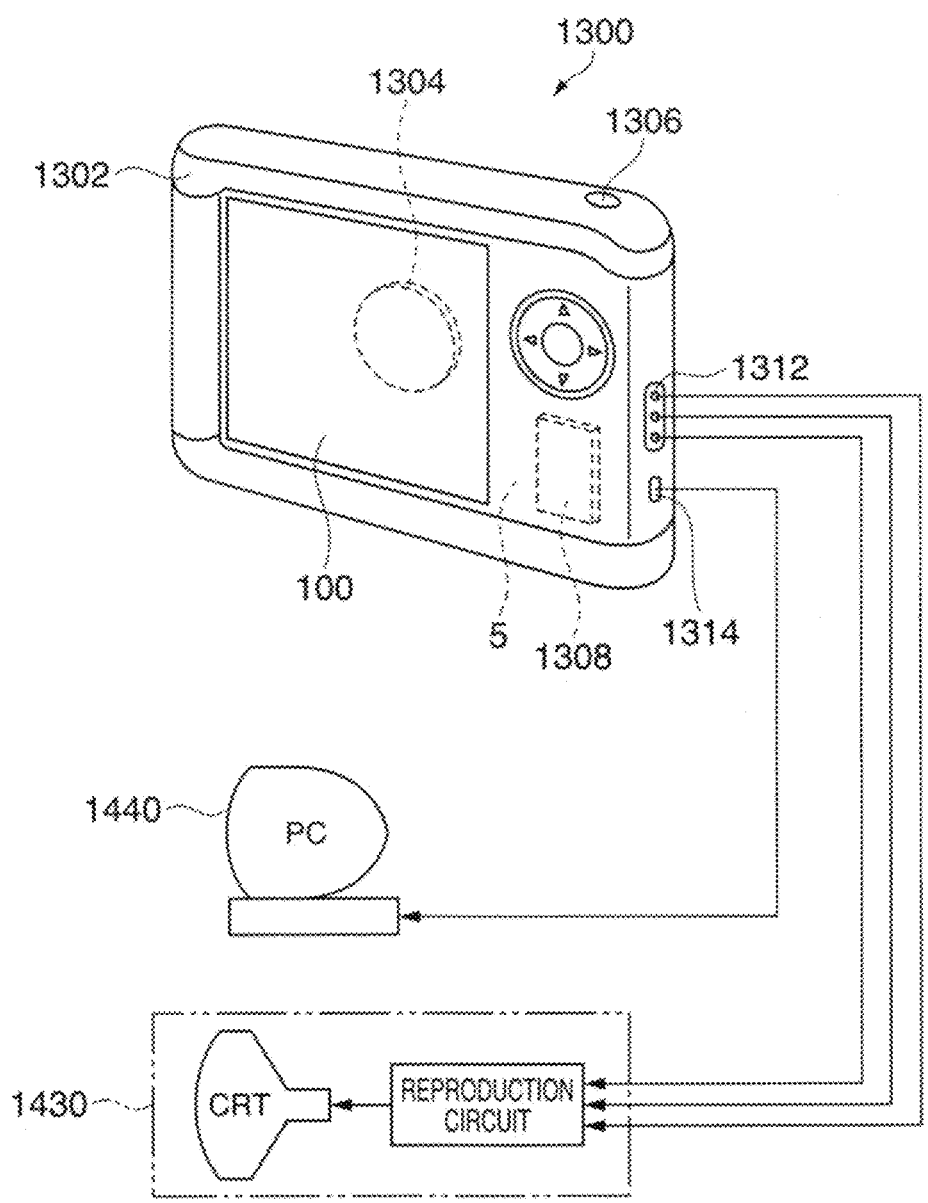
FIG. 22 is a perspective view showing a configuration of a digital still camera as another example of the electronic apparatus.

FIG. 22 is a perspective view showing a schematic configuration of a digital still camera as an electronic apparatus including the piezoelectric resonator 5 according to an embodiment of the invention. In addition, the drawing shows connection to an external device in a simple manner. Herein, in a general camera, a silver halide photographic film is exposed to light from an optical image of a subject, however, in the digital still camera 1300, an optical image of a subject undergoes photoelectric conversion by an imaging device such as a CCD (Charge Coupled Device) so as to generate an imaging signal (image signal).

On the back surface of a case (body) 1302 of the digital still camera 1300, the display section 100 is provided, display is performed based on an imaging signal of the CCD, and thus, the display section 100 functions as a finder that allows the subject to be displayed as an electronic image. In addition, on the front surface side (rear surface side in the drawing) of the case 1302, a light reception unit 1304 that includes an optical lens (imaging optical system), the CCD, and the like is provided.

When a photographer perceives an image of a subject displayed on the display section 100 and then presses a shutter button 1306, an imaging signal of the CCD at the time point is transferred to and then stored in a memory 1308. In addition, in the digital still camera 1300, a video signal output terminal 1312 and a data communication input and output terminal 1314 are provided on aside surface of the case 1302. Furthermore, as shown in the drawing, a television monitor 1430 is connected to the video signal output terminal 1312 and a personal computer 1440 is connected to the data communication input and output terminal 1314 respectively if necessary. Moreover, with a predetermined operation, the imaging signal stored in the memory 1308 is configured to be output to the television monitor 1430 and the personal computer 1440. In such a digital still camera 1300, the piezoelectric resonator 5 is built.

Furthermore, the piezoelectric resonator 5 according to an embodiment of the invention can be applied to other electronic apparatuses, for example, ink jet discharge devices (for example, ink jet printers), lap-top personal computers, televisions, video cameras, video tape recorders, car navigation devices, pagers, electronic organizers (including those with a communication function), electronic dictionaries, electronic calculators, electronic game devices, word processors, workstations, videophones, security television monitors, electronic binoculars, POS terminals, medical devices (for example, electronic thermometers, sphygmomanometers, blood glucose meters, electrocardiogram measuring devices, ultrasonographs, and electronic endoscopes), fishfinders, various measuring devices, meters and gauges (for example, meters and gauges of automobiles, aircraft, and vessels), flight simulators, and the like, in addition to the personal computer (portable type personal computer) of FIG. 20, the mobile telephone of FIG. 21, and the digital still camera of FIG. 22.

Mobile Object

Figure 23:
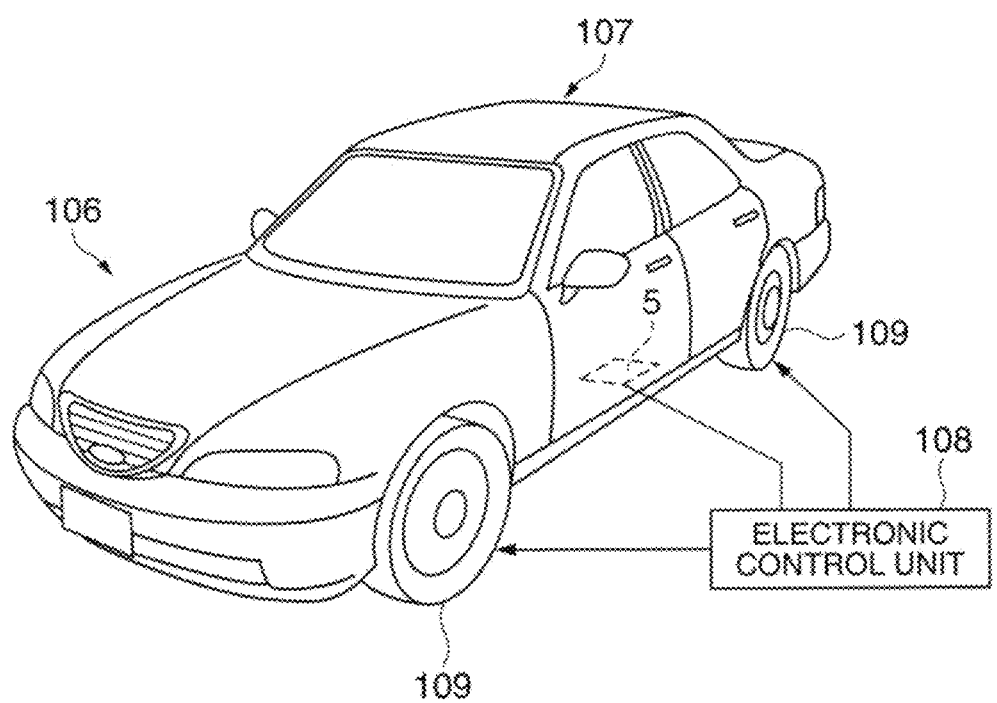
FIG. 23 is a perspective view showing a configuration of a vehicle as an example of a mobile object.

FIG. 23 is a perspective view schematically showing a vehicle as an example of a mobile object. In the vehicle 106, the piezoelectric resonator 5 according to an embodiment of the invention is mounted. As shown in the drawing, for example, the vehicle 106 as a mobile object includes the piezoelectric resonator 5 using a gyro element 2 and an electronic control unit 108 for controlling a tier 109, and the like is mounted on a vehicle body 107. In addition, the piezoelectric resonator 5 can be broadly applied to electronic control units (ECUs) including a keyless entry system, an immobilizer, a car navigation system, a car air-conditioner, an anti-lock braking system (ABS), an air bag, a tire pressure monitoring system (TPMS), an engine controller, a battery monitor of a hybrid or electronic vehicle, a vehicle body posture control system, and the like.

First Modification Example

As a technique of further reducing and suppressing stress caused by installation of a piezoelectric vibrating element, a configuration as shown below can be employed.

Figure 24A:
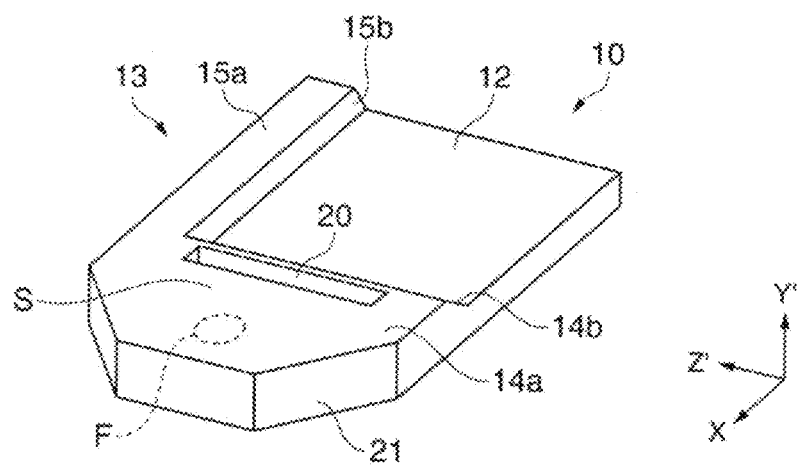
FIGS. 24A to 24C are configuration descriptive diagrams of a piezoelectric substrate according to a modification example.

The piezoelectric substrate 10 in a modification example of FIG. 24A includes the thin vibrating section 12 having a vibration area and the thick section 13 that is provided on a circumferential edge of the vibrating section 12 and thicker than the vibrating section 12. The thick section 13 includes the first thick section main body 14*a* and the second thick section main body 15*a*, and on the inner walls of the first and the second thick section main bodies 14*a* and 15*a* on the vibrating section 12 side, the first and the second inclined sections 14*b* and 15*b* are provided. In the first thick section main body 14*a*, the first inclined section 14*b* and a mounting portion F are arranged in an extended manner, interposing a buffer section S provided in the direction of a margin of the first thick section main body. The buffer section S has the slit 20 between the mounting section F and the first inclined section 14b. The mounting section F has chamfered sections 21 at both edge portions in the direction orthogonal to the direction in which the buffer section S and the thick section 13 are arranged.

Figure 24B:
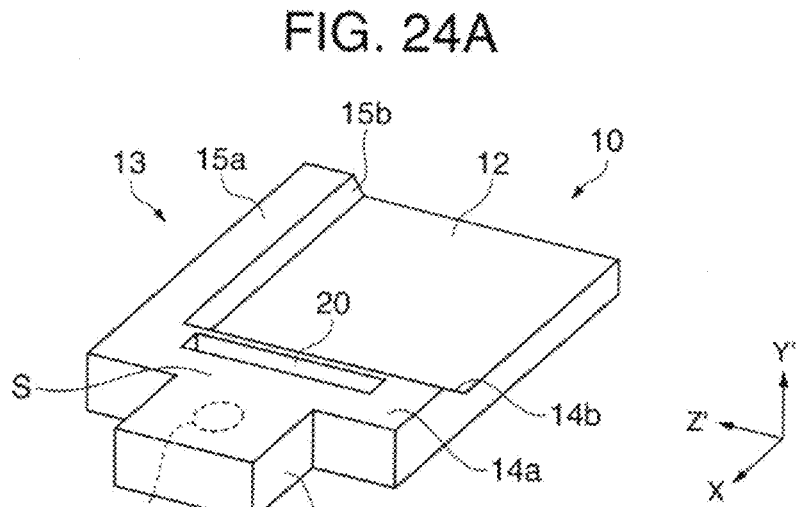

The piezoelectric substrate 10 of FIG. 24B includes the thin vibrating section 12 having a vibration area and the thick section 13 that is provided at a circumferential edge of the vibrating section 12 and is thicker than the vibrating section 12. The thick section 13 includes the first thick section main body 14a and the second thick section main body 15a, and on the inner walls of the first and the second thick section main bodies 14a and 15a on the vibrating section 12 side, the first and the second inclined sections 14b and 15b are provided. In the first thick section main body 14a, the first inclined section 14b and the mounting portion F are arranged in an extended manner, interposing the buffer section S provided in the direction of a margin of the first thick section main body. The buffer section S has the slit 20 between the mounting section F and the first inclined section 14b.

The mounting section F has cutout portions 22 at both ends thereof in the direction orthogonal (hereinafter, referred to as an orthogonal direction) to the direction in which the buffer section S and the thick section 13 are arranged. The longitudinal direction (stretching direction) of the slit 20 is parallel to the orthogonal direction. In addition, the width of the mounting section F in the orthogonal direction is set to be narrower than the width of the slit in the longitudinal direction. Both ends of the slit in the longitudinal direction are provided closer to the outer circumference of the buffer section S in the orthogonal direction than the both ends of the mounting section F.

Figure 24C:
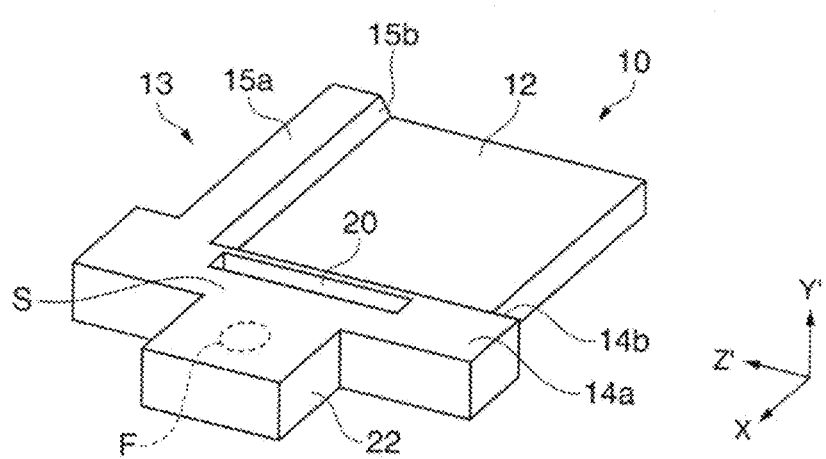

The piezoelectric substrate 10 of FIG. 24C includes the thin vibrating section 12 having a vibration area and the thick section 13 that is provided at a circumferential edge of the vibrating section 12. The thick section 13 includes the first thick section main body 14a and the second thick section main body 15a, and on the inner walls of the first and the second thick section main bodies 14a and 15a on the vibrating section 12 side, the first and the second inclined sections 14b and 15b are provided. To the first thick section main body 14a, the buffer section S and the mounting section F are continuously connected in this order. In addition, in the first thick section main body 14a, shoulders are provided of which both ends in the direction orthogonal (hereinafter, referred to as an orthogonal direction) to the direction in which the buffer section S and the thick section 13 are arranged further protrude than the total width of the second thick section main body 15a and the vibrating section 12. The buffer section S has the slit 20 between the mounting section F and the first inclined section 14b. The mounting section F has the cutout portions 22 at both ends thereof in the orthogonal direction.

Figure 25A:
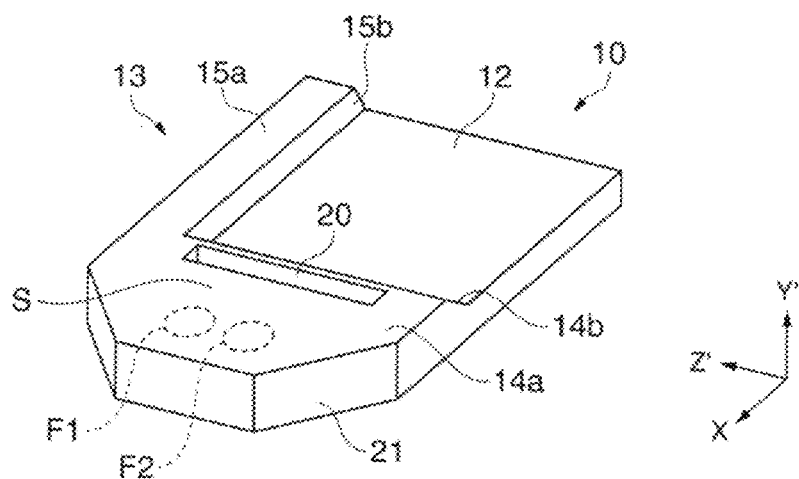
FIGS. 25A, 25B and 25C are configuration descriptive diagrams of a piezoelectric substrate according to another modification example.
Figure 25B:
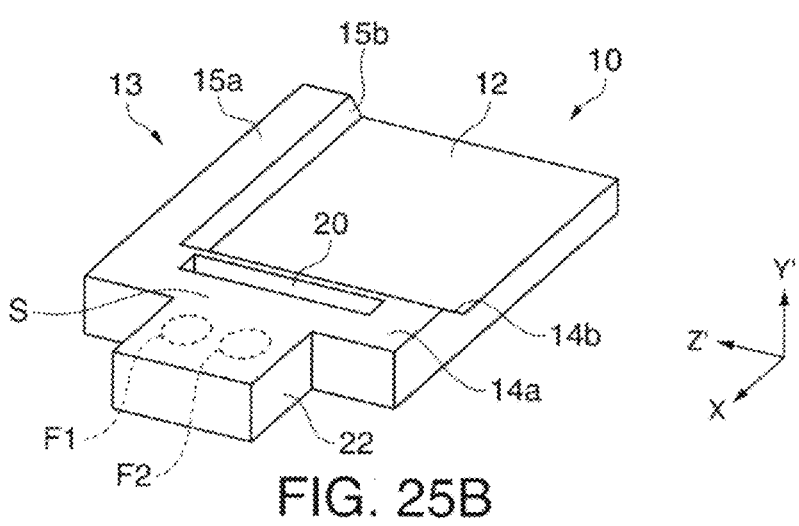
Figure 25C:
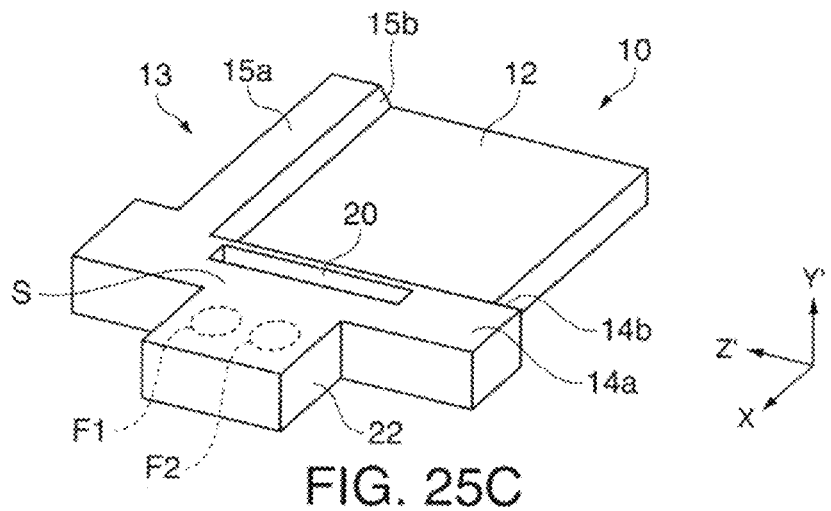

The configurations shown in FIGS. 25A to 25C are characterized of two-point support, different from the configurations shown in FIGS. 24A to 24C, that is, a form of mounting sections F1 and F2 horizontally provided.

Furthermore, in FIGS. 24A to 25C, the first and the second inclined sections 14b and 15b are shown on the inner walls of the first and the second thick section main bodies 14a and 15a of the thick section 13, and on the other hand, inclined surfaces as shown in FIGS. 14A and 14B are not shown on the outer side wall surfaces of the thick section 13, however, such inclined sections and inclined surfaces may be formed at the portions corresponding to those as shown in FIGS. 14A and 14B.

Furthermore, each reference numerals in FIGS. 24A to 25C corresponds to the portions denoted by the same reference numerals of the above-described embodiments.

Second Modification Example

Figure 26A:
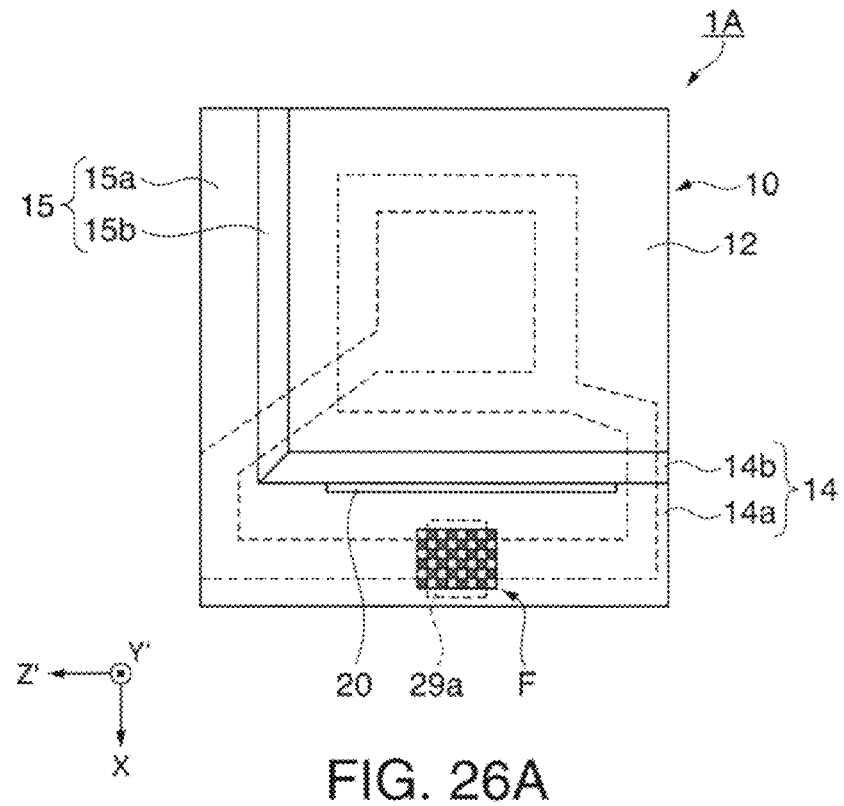
FIGS. 26A to 26C show a modification example of the piezoelectric vibrating element.
Figure 26B:
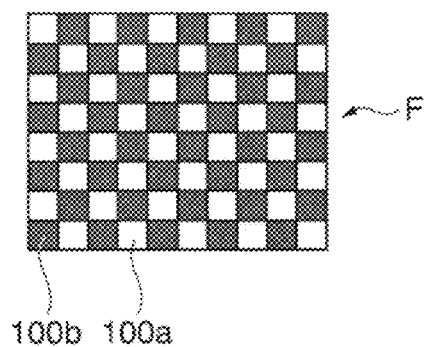
Figure 26C:
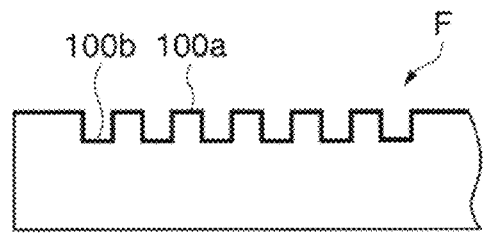

Further, FIG. 26A is a plane view of a piezoelectric vibrating element 1A, FIG. 26B shows an enlarged plan view of a pad electrode 29a (mounting section F) of the piezoelectric vibrating element 1A, and FIG. 26C shows a cross-sectional view of the pad electrode 29a (mounting section F). In the pad electrode 29a (mounting section F), an adhesive area is extended by forming the surface in an uneven shape so as to improve adhesion strength.

The entire disclosure of Japanese Patent Application No. 2011-179405, filed Aug. 19, 2011 and Japanese Patent Application No. 2012-143908, filed Jun. 27, 2012 is expressly incorporated by reference herein.

What is claimed is:

1. A resonator having a resonating element, the resonator comprising:
   a substrate that includes a vibrating section having a vibration area and a thick section that is formed integrally with the vibrating section, a thickness of the thick section being larger than a thickness of the vibrating section; and
   an excitation electrode that is provided in the vibration area, wherein
   the thick section includes a first thick section that is provided along one side of the vibrating section,
   a first plane of the first thick section protrudes further than a second plane of the vibrating section,
   the first thick section includes
      a first inclined section of which a thickness increases as the first thick section is apart from one circumferential edge thereof that comes into continuous contact with the one side of the vibrating section toward the other circumferential edge, and
      a first thick section main body that comes into continuous contact with the other circumferential edge of the first inclined section,
   a package houses the resonating element, and
   at least one slit is provided in the first thick section, the at least one slit extends along the one side of the vibrating section, the at least one slit has a vacant inside space, the at least one slit is formed from a to surface of the first thick section to a bottom surface of the first thick section so that the slit penetrates the first thick section, and the at least one slit is provided between the vibrating section and a region where the thick section is supported by the package.

2. The resonator according to claim 1, wherein
   centering around an X axis of an orthogonal coordinate system including the X axis as an electrical axis, a Y axis as a mechanical axis, and a Z axis as an optical axis that are crystal axes of quartz crystal, the substrate
   sets an axis obtained by inclining the Z axis toward the −Y direction of the Y axis to a Z' axis,
   sets an axis obtained by inclining the Y axis toward the +Z direction of the Z axis to a Y' axis,
   has a plane including the X axis and the Z' axis as a main plane, and
   is a quartz crystal substrate having thickness in the direction along the Y' axis.

3. The resonator according to claim 2, wherein the first plane of the first thick section protrudes from the second plane of the vibrating section in the +Y direction of the Y' axis.

4. The resonator according to claim 2, wherein the first thick section is provided in the +X direction of the X axis.

5. The resonator according to claim 1, wherein the slit is provided in the first thick section main body along a boundary between the first inclined section and the first thick section main body.

6. The resonator according to claim 1, wherein the slit is provided within the first inclined section as being spaced apart from the one side of the vibrating section.

7. The resonator according to claim 1, wherein the slit includes
a first slit that is provided in the first thick section main body, and
a second slit that is provided within the first inclined section as being spaced apart from the one side of the vibrating section.

8. The resonator according to claim 7, wherein the first slit is provided in the first thick section main body along a boundary between the first inclined section and the first thick section main body.

9. An electronic device comprising:
the resonator according to claim 1;
an electronic component; and
the package in which the resonating element and the electronic component are accommodated.

10. The electronic device according to claim 9, wherein the electronic component is any one of a variable capacitance element, a thermistor, an inductor, and a capacitor.

11. An electronic device comprising:
the resonator according to claim 1;
an oscillator circuit that drives the resonating element; and
the package in which the resonating element and the oscillator circuit are accommodated.

12. An electronic apparatus comprising:
the resonator according to claim 1.

13. A mobile object comprising:
the resonator according to claim 1.

14. The resonator according to claim 1, wherein one surface of the substrate is even, and the other surface of the substrate is uneven.

15. The resonator according to claim 1, wherein the thick section further includes a second thick section that is provided along another side of the vibrating section, the another side is located next to the one side of the vibrating section,
the first thick section is continuous to the second thick section by each one end thereof, and
a third plane of the second thick section protrudes further than the second plane of the vibrating section.

16. The resonator according to claim 15, wherein centering around an X axis of an orthogonal coordinate system including the X axis as an electrical axis, a Y axis as a mechanical axis, and a Z axis as an optical axis that are crystal axes of quartz crystal, the substrate
sets an axis obtained by inclining the Z axis toward the −Y direction of the Y axis to a Z' axis,
sets an axis obtained by inclining the Y axis toward the +Z direction of the Z axis to a Y' axis,
has a plane including the X axis and the Z' axis as a main plane,
is a quartz crystal substrate having thickness in the direction along the Y' axis, and
a second thick section is provided along another side of the vibrating section, the another side is located next to the one side of the vibrating section, and the second thick section is provided in the +Z' direction of the Z' axis.

17. A resonator having a resonating element, the resonator comprising:
a substrate that is formed in a quadrangle shape, the substrate that has first and second surface opposite to each other, the second surface being even;
a vibrator that is formed on the first surface of the substrate along first and second sides of the substrate;
a first thick member that is formed on the first surface of the substrate along a third side of the substrate, the first thick member being continuously connected to the vibrator;
a second thick member that is formed on the first surface of the substrate along a fourth side of the substrate, the second thick member being continuously connected to the vibrator and the first thick member; and
an excitation electrode that is provided at the vibrator, wherein
a first top surface of the first thick member and a second top surface of the second thick member are protruded from a third top surface of the vibrator,
the first thick member has a slope that is continuously formed from an edge of the first top surface of the first thick member toward an edge of the third top surface of the vibrator, and the first thick member has a slit that has a vacant inside space, the slit extends along the third side of the substrate, and the slit is formed from the first to surface of the first thick member to the second surface of the substrate so that the slit penetrates the first thick member,
a package houses the resonating element, and
the slit is provided between the vibrator and a region where the first thick member is supported by the package.

18. The resonator according to claim 17, wherein the slit is formed in the edge of the first top surface of the first thick member.

19. The resonator according to claim 18, wherein the first thick member has another slit that has a vacant inside space, and
the another slit is formed in the slope of the first thick member.

20. The resonator according to claim 17, wherein the slit is formed in the slope of the first thick member.

* * * * *